(12) United States Patent
Kaneko et al.

(10) Patent No.: US 8,004,871 B2
(45) Date of Patent: Aug. 23, 2011

(54) SEMICONDUCTOR MEMORY DEVICE INCLUDING FET MEMORY ELEMENTS

(75) Inventors: Yukihiro Kaneko, Osaka (JP); Yoshihisa Kato, Shiga (JP)

(73) Assignee: Panasonic Corporation, Osaka (JP)

( * ) Notice: Subject to any disclaimer, the term of this patent is extended or adjusted under 35 U.S.C. 154(b) by 204 days.

(21) Appl. No.: 12/405,799

(22) Filed: Mar. 17, 2009

(65) Prior Publication Data

US 2009/0290404 A1  Nov. 26, 2009

(30) Foreign Application Priority Data

May 26, 2008  (JP) ................... 2008-137240
Jun. 9, 2008   (JP) ................... 2008-150276

(51) Int. Cl.
*G11C 11/22* (2006.01)
(52) U.S. Cl. ............ 365/145; 257/295; 257/E27.104
(58) Field of Classification Search ............ 365/145 O, 365/148, 145; 257/295 X, E27.104 X, 295, 257/E27.104
See application file for complete search history.

(56) References Cited

U.S. PATENT DOCUMENTS

| | | | |
|---|---|---|---|
| 5,384,731 A * | 1/1995 | Kuriyama et al. ............ 365/182 |
| 5,600,163 A | 2/1997 | Yano et al. | |
| 6,054,734 A * | 4/2000 | Aozasa et al. ................ 257/315 |
| 6,744,087 B2 * | 6/2004 | Misewich et al. ............ 257/295 |
| 6,836,431 B2 | 12/2004 | Chang | |
| 7,410,845 B2 * | 8/2008 | Walker ........................ 438/157 |
| 7,639,524 B2 * | 12/2009 | Kang et al. .................. 365/151 |
| 7,643,326 B2 * | 1/2010 | Kang et al. .................. 365/145 |
| 2005/0196064 A1 | 9/2005 | Sugimoto | |
| 2007/0012988 A1 | 1/2007 | Bhattacharyya | |

FOREIGN PATENT DOCUMENTS

| | | |
|---|---|---|
| JP | 3067200 | 3/1991 |
| JP | 04-192173 | 7/1992 |
| JP | 05-205487 | 8/1993 |
| JP | 06-196647 | 7/1994 |
| JP | 08-087878 | 4/1996 |
| JP | 2921812 | 7/1999 |
| JP | 2005-252869 | 9/2000 |

* cited by examiner

*Primary Examiner* — VanThu Nguyen
(74) *Attorney, Agent, or Firm* — McDermott Will & Emery LLP

(57) ABSTRACT

A memory cell includes a memory element including a MFSFET having a gate insulating film made of a ferroelectric film, and a selection switching element including a MISFET having a gate insulating film made of a paraelectric film. A load element for a read operation is connected in series to the memory cell. The ferroelectric film and the paraelectric film are stacked with a semiconductor film being interposed therebetween. The semiconductor film forms a common channel shared by the MFSFET and the MISFET. The load element includes a MISFET having a channel made of the semiconductor film or a resistance element having a resistor made of the semiconductor film.

9 Claims, 19 Drawing Sheets

FIG.6

| | write operation | read operation |
|---|---|---|
| first gate electrode (12) | data "1" +10V<br>data "0"    0V | 0V |
| second gate electrode (17a) | +10V | +10V |
| second gate electrode (17b) | +10V | +10V |
| drain electrode (15a) | data "1"    0V<br>data "0" +10V | +1V |
| source electrode (15b) | data "1"    0V<br>data "0" +10V | 0V |

| load resistance (Ω) | | FeFET resistance (Ω) | | | |
|---|---|---|---|---|---|
| | | $1 \times 10^6$ data "3" | $1 \times 10^8$ data "2" | $1 \times 10^{10}$ data "1" | $1 \times 10^{12}$ data "0" |
| $2 \times 10^7$ | Vout | 0.10 | 1.50 | 1.80 | 1.80 |
| | $V_D$ | 0.09 | 1.50 | 1.80 | 1.80 |
| | $V_S$ | 0.01 | 0.00 | 0.00 | 0.00 |
| $2 \times 10^9$ | Vout | 0.00 | 0.09 | 1.50 | 1.80 |
| | $V_D$ | 0.00 | 0.09 | 1.50 | 1.80 |
| | $V_S$ | 0.00 | 0.00 | 0.00 | 0.00 |
| $2 \times 10^{11}$ | Vout | 0.00 | 0.00 | 0.09 | 1.50 |
| | $V_D$ | 0.00 | 0.00 | 0.09 | 1.50 |
| | $V_S$ | 0.00 | 0.00 | 0.00 | 0.00 |

SEMICONDUCTOR MEMORY DEVICE INCLUDING FET MEMORY ELEMENTS

BACKGROUND

Nonvolatile memories using ferroelectric materials are broadly divided into two types: a capacitor-type, and a field effect transistor (FET)-type having a gate insulating film made of a ferroelectric film.

Capacitor-type nonvolatile ferroelectric memories are similar in structure to dynamic random access memories (DRAMs). Data in a capacitor-type nonvolatile ferroelectric memory is stored as a direction of polarization of the ferroelectric material caused by charges held in a ferroelectric capacitor. One polarization direction represents "0", while the other polarization direction represents "1". The polarization accumulated in the ferroelectric capacitor is coupled to charges induced by the upper and lower electrodes thereof, and therefore, does not dissipate when the voltage is cut off. However, when the data is read, the stored polarization is destroyed, so that the data is lost. In this technique, therefore, an operation for rewriting the data is needed. As a result, polarization reversal repeatedly occurs due to repetition of the rewrite operation performed after each read operation, leading to polarization fatigue. In addition, in this structure, since polarization charges are read by a sense amplifier, the amount of charges (typically 100 fC) equal to or larger than the sense limit of the sense amplifier is required. The amount of polarization charges per unit area of a ferroelectric material is material-specific. Hence, the electrode area required is constant as long as the same material is used, no matter how much a memory cell is miniaturized. It is therefore difficult to reduce the capacitor size in direct proportion to the miniaturization of process rules, and capacitor-type ferroelectric memories are thus unsuitable for an increase in capacity.

In contrast to this, in FET-type ferroelectric memories, data is read by detecting the conductive state of a channel which varies depending on the direction of polarization of a ferroelectric film. This allows non-destructive reading of data. Also, the amplitude of an output voltage can be increased through the amplifying operation of a FET. Therefore, FET-type ferroelectric memories can be miniaturized in accordance with the scaling law. A FET-type transistor has conventionally been proposed in which a ferroelectric film serving as a gate insulating film is formed on a silicon substrate serving as a channel. This structure is called a Metal-Ferroelectric-Semiconductor (MFS) FET.

In a memory cell array in which FET-type ferroelectric memories are arranged in a matrix with rows and columns, binary data is written into a ferroelectric memory by applying a voltage pulse between a gate electrode connected to a word line of a selected memory cell and a source electrode connected to a source line of the selected memory cell. In this case, however, a voltage is also applied to other memory cells which are connected to the word line and the source line of the selected memory cell and which are not to be accessed, resulting in erroneous writing of data, which is so-called "write disturbance". Therefore, typically, a selection switch including, for example, a Metal-Insulator-Semiconductor FET (MISFET) is interposed between the word line and the gate electrode and/or between the source line and the source electrode, thereby preventing the write disturbance (see, for example, Japanese Unexamined Patent Application Publication No. H05-205487).

SUMMARY

However, when a MFSFET serving as a memory element and a MISFET serving as a selection switch are placed side by side in order to prevent the write disturbance, it is necessary to provide at least an area for electrically separating the gate electrodes of these FETs, leading to an increase in cell size.

In view of the aforementioned problems, the present invention has been achieved. A main object of the present invention is to provide a highly integrated semiconductor memory device which includes FET memory elements having a small cell size and can reliably perform a read operation.

A semiconductor memory device according to an aspect of the present invention includes: a memory cell including a memory element including a first field effect transistor having a gate insulating film made of a ferroelectric film, and a selection switching element including a second field effect transistor having a gate insulating film made of a paraelectric film; and a load element for a read operation connected in series to the memory cell. The ferroelectric film and the paraelectric film are stacked with a semiconductor film being interposed therebetween. The semiconductor film forms a common channel shared by the first field effect transistor and the second field effect transistor. The load element includes a third field effect transistor having a channel made of the semiconductor film or a resistance element having a resistor made of the semiconductor film.

With such a configuration, a first gate electrode of the MFSFET included in the memory element and a second gate electrode of the MISFET included in the selection switching element can be arranged in proximity with each other in a plane, so that the cell size can be caused to be small. In addition, the load element for a read operation is made of the semiconductor film which forms the channel of the MFSFET, so that the element size similar to that of the memory cell can be achieved. As a result, a highly integrated semiconductor memory device which can reliably perform a read operation can be achieved.

A semiconductor memory device according to another aspect includes: a memory cell including a first field effect transistor having a gate insulating film made of a ferroelectric film and a channel made of a semiconductor film; and a load element for a read operation connected in series to the memory cell. The memory cell stores, as multi-level data, at least three channel resistance values corresponding to respective polarization states of the ferroelectric film. The multi-level data stored in the memory cell is read by detecting an intermediate potential between the memory cell and the load element. The read operation is performed by determining the multi-level data stored in the memory cell in order of the channel resistance value, highest first.

With such a configuration, multi-level data stored in the memory cell can be easily read without destroying data stored as a low channel resistance value.

BRIEF DESCRIPTION OF THE DRAWINGS

FIG. 6 is a table showing voltages applied to electrodes during an operation of the semiconductor memory device of the first embodiment.

DETAILED DESCRIPTION

The present applicants disclose, in the specification of Japanese Patent Application No. 2007-103754, a novel configuration of a semiconductor memory cell which includes a MFSFET including a selection switching element and whose cell size can be reduced.

Figure 19A:
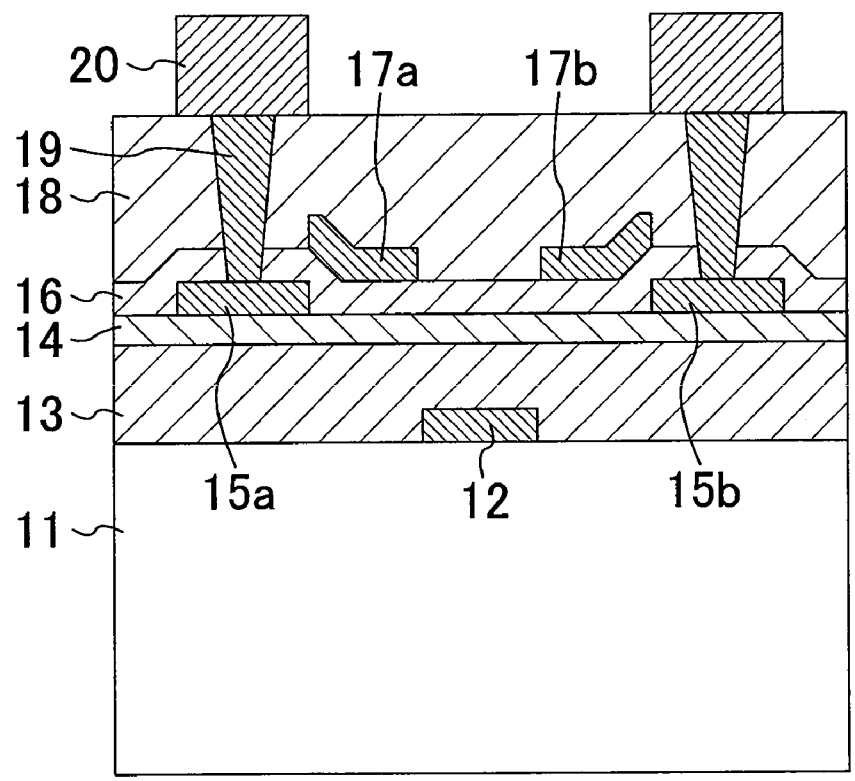
FIG. 19A is a cross-sectional view showing a configuration of a memory cell including a MFSFET having a selection switching element.
Figure 19B:
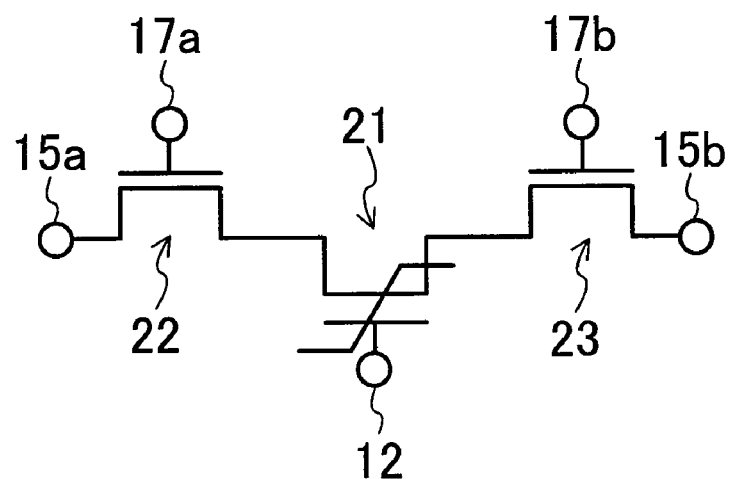
FIG. 19B is an equivalent circuit diagram of the memory cell of FIG. 19A.

FIGS. 19A and 19B are diagrams for describing a configuration of a semiconductor memory cell disclosed in the specification of the aforementioned application filed by the present applicant. FIG. 19A is a cross-sectional view thereof, and FIG. 19B is an equivalent circuit diagram thereof.

As shown in FIG. 19A, a ferroelectric film 13 and a paraelectric film 16 are formed and stacked on a substrate 11 with a semiconductor film 14 being interposed between the ferroelectric film 13 and the paraelectric film 16. A gate electrode 12 of a MFSFET 21 constituting a memory element is formed on the ferroelectric film 13, while gate electrodes 17a and 17b of MISFETs 22 and 23 constituting selection switching elements are formed on the paraelectric film 16. The semiconductor film 14 constitutes a common channel shared by the MFSFET 21 and the MISFETs 22 and 23. On the semiconductor film 14, a common source electrode 15a and a common drain electrode 15b shared by the MFSFET 21 and the MISFETs 22 and 23 are formed.

In other words, in the semiconductor memory cell, the bottom-gate MFSFET (memory element) 21 and the top-gate MISFETs (selection switching elements) 22 and 23 are stacked. As can be seen from the equivalent circuit of FIG. 19B, the MFSFET 21 and the MISFET 22 are connected in series.

With such a structure, the gate electrode 12 of the MFSFET 21 constituting a memory element and the gate electrodes 17a and 17b of the MISFETs 22 and 23 constituting selection switching elements can be provided in proximity to each other in a plane. As a result, the cell size can be reduced.

Next, an operation of the semiconductor memory cell will be described with reference to FIGS. 20A and 20B.

Data is written into the memory element 21 as follows. While a voltage is applied to the gate electrode 17a to cause the MISFET 22 to be in the ON state, a voltage is applied between the drain electrode 15b and the gate electrode 12, thereby generating an electric field perpendicular to the ferroelectric film 13, so that the polarization state of the ferroelectric film 13 is changed.

Figure 20A:
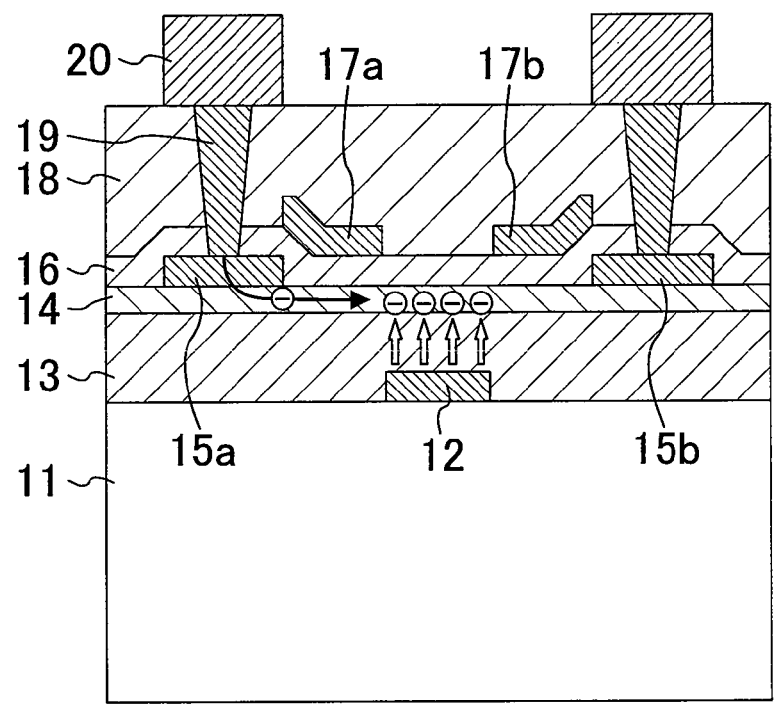
FIGS. 20A and 20B are cross-sectional views for describing an operation of a memory cell including a MFSFET having a selection switching element.
Figure 20B:
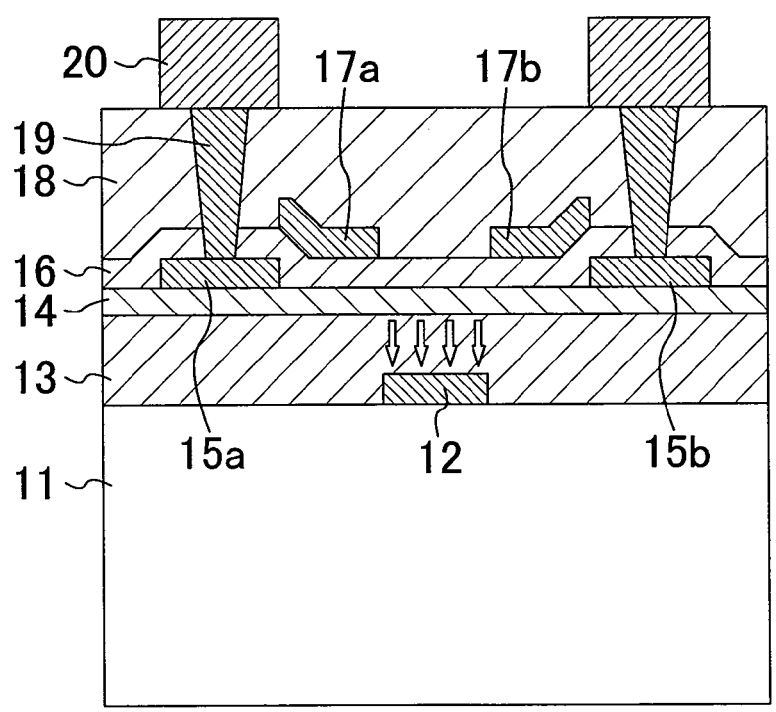

For example, when data "1" is written, an upward electric field is applied to the ferroelectric film 13, so that the polarization of the ferroelectric film 13 is directed upward, as shown in FIG. 20A. When data "0" is written, a downward electric field is applied to the ferroelectric film 13, so that the polarization of the ferroelectric film 13 is directed downward, as shown in FIG. 20B.

Data written in the memory element 21 is read as follows. While a voltage is applied to the gate electrodes 17a and 17b to cause the MISFETs 22 and 23 to be in the ON state, a voltage is applied between the drain electrode 15b and the source electrode 15a, and a current which flows through the channel (semiconductor film) 14, depending on the polarization state of the ferroelectric film 13, is detected. For example, a large drain current flowing therethrough can be determined as "1", while a small drain current flowing therethrough can be determined as "0".

When data written in a memory element is read by detecting a drain current, a current detecting circuit requires a large cell size. To avoid this, typically, a load element is connected in series to a memory element, and data written in the memory element is read by detecting an intermediate potential between the memory element and the load element.

In this case, the resistance value of the load element is set to any value between an OFF resistance value and an ON resistance value of the memory element. Therefore, if a power source voltage is reduced as the speed and power consumption of the semiconductor memory device (and a semiconductor integrated circuit device including it) are improved, the read margin decreases. Therefore, in order to ensure a sufficient read margin, it is desirable to set the resistance value of the load element to be about 1/10 of the OFF resistance value and about 10 times as large as the ON resistance value.

It is also desirable that the load element be made of silicon, taking into consideration a match between the load element and a peripheral circuit. However, since the OFF resistance of a MFSFET is considerably large (typically, about 1 TΩ) as described below, the load element made of silicon would have a considerably large element size.

Therefore, the present inventors have focused attention on a difference in dielectric constant between the gate insulating films of the MISFET constituting a selection switching element and the MFSFET constituting a memory element which are formed, sharing a channel (semiconductor film) in the structure of the semiconductor memory device.

Specifically, the drain current of a FET is proportional to the gate capacitance ($\in$/t; $\in$ is the dielectric constant of the gate insulating film, and t is the film thickness of the gate insulating film). The dielectric constant of a paraelectric material is typically about 1/20 to 1/30 of the dielectric constant of a ferroelectric material. Therefore, by adjusting the ratio of the film thickness of the gate insulating film of the MISFET to the film thickness of the gate insulating film of the MFSFET, it is possible to form a load element (MISFET) having a resistance value which is about 1/10 of the OFF resistance value of the MFSFET and having an element size similar to that of the MFSFET.

Hereinafter, embodiments of the present invention will be described with reference to the drawings. In the description that follows, like elements are designated throughout the specification and drawings with the same reference symbols, respectively, for the sake of simplicity. It should be noted that the present invention is not limited to the embodiments.

First Embodiment

Figure 1:
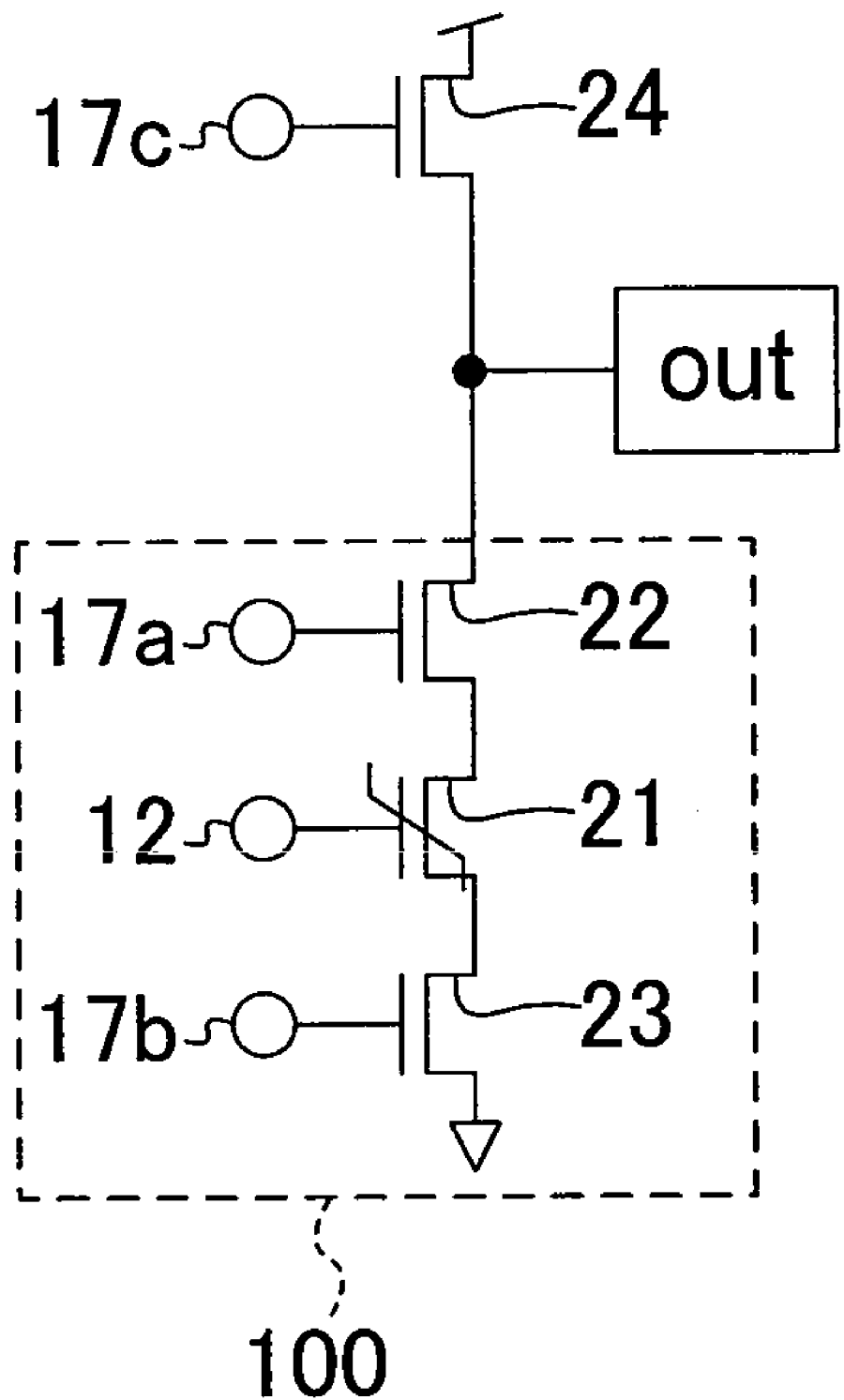
FIG. 1 is a circuit diagram showing a configuration of a semiconductor memory device according to a first embodiment of the present invention.

FIG. 1 is a circuit diagram showing a configuration of a semiconductor memory device according to this embodiment. A memory element including a MFSFET (first field effect transistor) 21 having a gate insulating film made of a ferroelectric film, and selection switching elements including MISFETs (second field effect transistors) 22 and 23 having a gate insulating film made of a paraelectric film, constitute a memory cell 100. The selection switching elements are provided on both sides of the memory element. A load element for a read operation including a MISFET (third field effect transistor) 24 is connected in series to the memory cell 100.

Note that a typical semiconductor memory device includes the memory cells 100 arranged in a matrix with rows and columns. In this case, one load element 24 is connected to a plurality of memory cells. However, it is here assumed, for the sake of simplicity, that one load element 24 is connected to one memory cell 100.

Figure 2A:
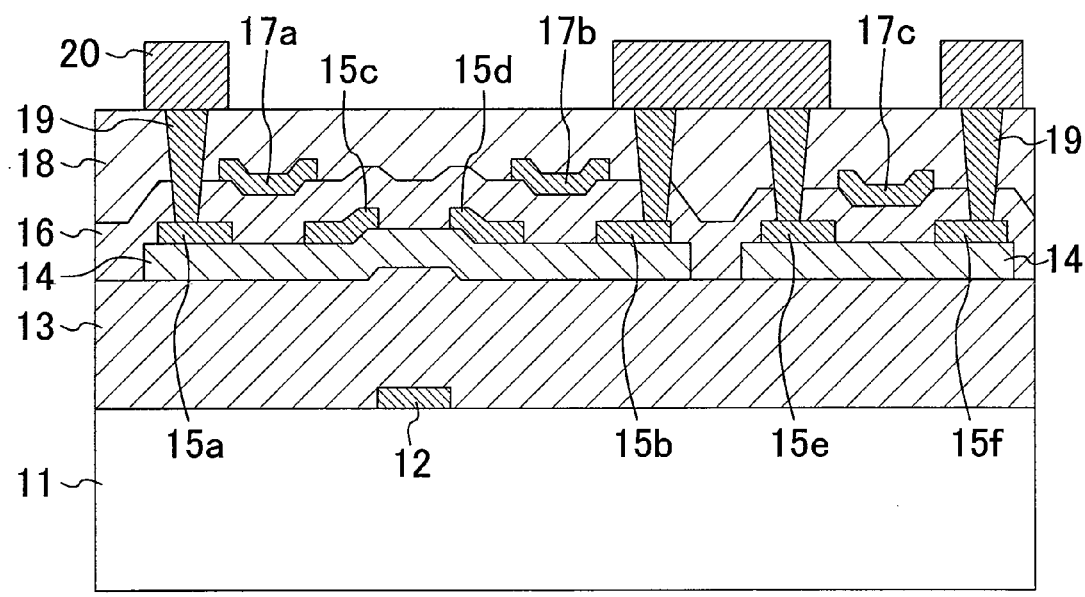
FIG. 2A is a cross-sectional view showing a configuration of the semiconductor memory device of the first embodiment of the present invention.
Figure 2B:
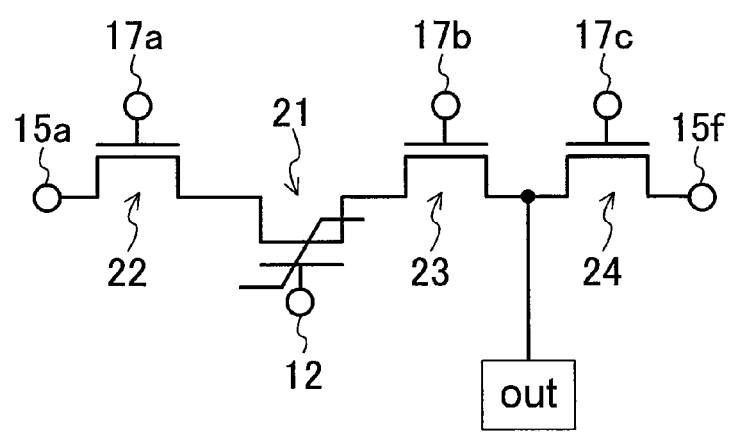
FIG. 2B is an equivalent circuit diagram of the semiconductor memory device of the first embodiment of the present invention.

FIGS. 2A and 2B are diagrams showing a basic configuration of the semiconductor memory device of this embodiment. FIG. 2A is a cross-sectional view thereof, and FIG. 2B is an equivalent circuit diagram thereof. Note that the configuration of the memory cell 100 is basically the same as that of the memory cell of FIGS. 19A and 19B.

As shown in FIG. 2A, a ferroelectric film 13 and a paraelectric film 16 are formed and stacked on a substrate 11 with a semiconductor film 14 being interposed between the ferroelectric film 13 and the paraelectric film 16. A first gate electrode 12 of the MFSFET 21 is formed on the ferroelectric film 13, while gate electrodes 17a and 17b of the MISFETs 22 and 23 are formed on the paraelectric film 16.

Here, the semiconductor film 14 constitutes a common channel shared by the MFSFET 21 and the MISFETs 22 and 23. On the semiconductor film 14, a common source electrode 15a and a common drain electrode 15b shared by the MFSFET 21 and the MISFETs 22 and 23 are formed.

Moreover, a third gate electrode 17c of a MISFET 24 is formed on the paraelectric film 16, and source/drain electrodes 15e and 15f of the MISFET 24 are formed on the semiconductor film 14. Here, a channel of the MISFET 24 is made of the same semiconductor film 14 that constitutes the channel of the MFSFET 21 and the MISFETs 22 and 23.

A specific configuration of the semiconductor memory device of this embodiment will be hereinafter described.

As shown in FIG. 2A, the first gate electrode 12 made of a strontium ruthenate (SrRuO$_3$, hereinafter referred to as SRO) film having a thickness of 30 nm is formed on a (100) surface of the substrate 11 made of single-crystal strontium titanate (SrTiO$_3$, hereinafter referred to as STO). Also, the ferroelectric film 13 made of a lead zirconate titanate (Pb(Zr, Ti)O$_3$, hereinafter referred to as PZT) film having a thickness of 450 nm, and constituting a gate insulating film, and the semiconductor film 14 made of a zinc oxide (ZnO, an n-type oxide semiconductor) film having a thickness of 30 nm, and constituting a channel, are stacked on the substrate 11. Source/drain electrodes 15a to 15f made of a multilayer film including a titanium (Ti) film having a thickness of 20 nm and a platinum (Pt) film having a thickness of 30 nm are formed on the semiconductor film 14. In this case, the electrode 15c serves as a source electrode for the first gate electrode 12 and as a drain electrode for the second gate electrode 17a. The electrode 15d serves as a drain electrode for the first gate electrode 12 and as a source electrode for the second gate electrode 17b.

The paraelectric film 16 made of a silicon nitride (SiN) film having a thickness of 100 nm, and constituting a gate insulating film is formed on the semiconductor film 14. The second gate electrodes 17a and 17b and the third gate electrode 17c made of a multilayer film including a Ti layer having a thickness of 30 nm and a Pt film having a thickness of 17 nm are formed on the paraelectric film 16. An interlayer insulating film 18 made of a silicon dioxide (SiO$_2$) film is formed on the paraelectric film 16. Moreover, tungsten plugs 19 connected to the source/drain electrodes 15a, 15b, 15e and 15f are formed in the interlayer insulating film 18 and the paraelectric film 16. An aluminum wiring line 20 connecting the tungsten plugs 19 is formed on the interlayer insulating film 18.

Note that the source/drain electrodes 15a and 15c and the second gate electrode 17a desirably overlap each other as viewed from the top; the source/drain electrodes 15c and 15d and the first gate electrode 12 desirably overlap each other as viewed from the top; the source/drain electrodes 15d and 15b and the second gate electrode 17b desirably overlap each other as viewed from the top; and the source/drain electrodes 15e and 15f and the third gate electrode 17c desirably overlap each other as viewed from the top.

In the memory cell of this embodiment, the bottom-gate MFSFET (memory element) 21 and the top-gate MISFETs (selection switching elements) 22 and 23 are stacked, and the second gate electrodes 17a and 17b of the MISFETs 22 and 23 are provided on both sides of the first gate electrode 12 of the MFSFET 21 as viewed from the top. Therefore, even when selection switching elements are provided to a memory element, the cell size can be caused to be small.

Moreover, in the semiconductor memory device of this embodiment, the MISFET (load element for a read operation) 24 having the same structure as that of the selection switching element is provided on a side of the memory cell. The drain electrode 15b of the memory cell and the source electrode 15e of the load element are electrically connected to each other via the tungsten plug 19 and the aluminum wiring line 20.

Specifically, as shown in FIG. 2B, in the semiconductor memory device of this embodiment, the MISFET 22 (selection switching element), the MFSFET 21 (memory element), the MISFET 23 (selection switching element), and the MISFET 24 (load element) are connected in series.

Next, a basic operation of the semiconductor memory device of this embodiment will be described.

Firstly, a polarization characteristic of the PZT film 13 used as the gate insulating film of the MFSFET 21 will be described. An electrode made of an SRO film and an electrode of a Ti film were formed on both surfaces of the PZT film 13 having a thickness of 450 nm, respectively. A remanent polarization density 2 Pr resulting from application of an electric field to the PZT film 13 was measured. As a result, when a voltage of 3 V or more was applied between the electrodes, the polarization was reversed. When a voltage of ±10 V was applied and the voltage was then changed back to 0 V, the remnant polarization density 2 Pr was 60 μC/cm$^2$.

Also, the ZnO film 14 having a thickness of 30 nm was formed on the PZT film 13. The carrier concentration of the ZnO film 14 was measured by Hall measurement. The result was 2×10$^{15}$ cm$^{-3}$. Since the thickness of the ZnO film 14 was 30 nm, the carrier density per unit area was 6×10$^9$ cm$^{-2}$. By multiplying this by the elementary charge 1.6×10$^{-19}$ C, a charge density of 9.6×10$^{-4}$ μC/cm$^2$ is obtained, which is smaller than the polarization charge density of the PZT film 13. Therefore, when the polarization of the PZT film 13 has a downward direction, the polarization repels and pushes away carriers in the ZnO film 14, resulting in the depletion of the channel. On the other hand, when the polarization of the PZT film 13 has an upward direction, carriers having a density corresponding to the polarization density are induced at an interface between the PZT film 13 and the ZnO film 14.

Next, channel conductivity modulation which is performed using carrier concentration modulation of the ZnO film 14 by the polarization of the PZT film 13 will be described. When a negative voltage is applied to the first gate electrode 12 of the MFSFET 21, the polarization of the PZT film 13 is directed downward, resulting in the depletion of the ZnO film 14, which leads to a decrease in channel conductivity. In other words, the MFSFET 21 transitions to the OFF state. On the other hand, when a positive voltage is applied to the first gate electrode 12, the polarization of the PZT film 13 is directed upward, resulting in an increase in carrier concentration, which leads to an increase in channel conductivity. In other words, the MFSFET 21 transitions to the ON state. Thus, the conductive or non-conductive state of the channel (ZnO film) 14 can be controlled, depending on a voltage applied to the first gate electrode 12. In addition, even when the voltage applied to the first gate electrode 12 is removed, the polarization of the PZT film 13 remains, so that the conductive or non-conductive state is maintained.

To confirm this, a sub-threshold characteristic of the MFSFET 21 was examined.

Figure 3A:
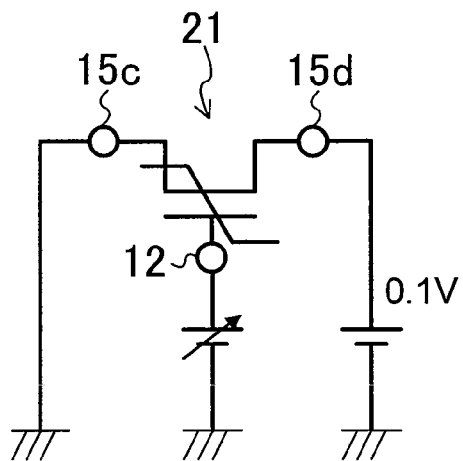
FIG. 3A is a circuit diagram showing a method for measuring a sub-threshold characteristic of a MFSFET according to the first embodiment.

As shown in FIG. 3A, a drain current $I_{DS}$ was measured by sweeping the voltage of the gate electrode 12 while the source electrode 15c was grounded and a voltage of 0.1 V was applied to the drain electrode 15d.

Figure 3B:
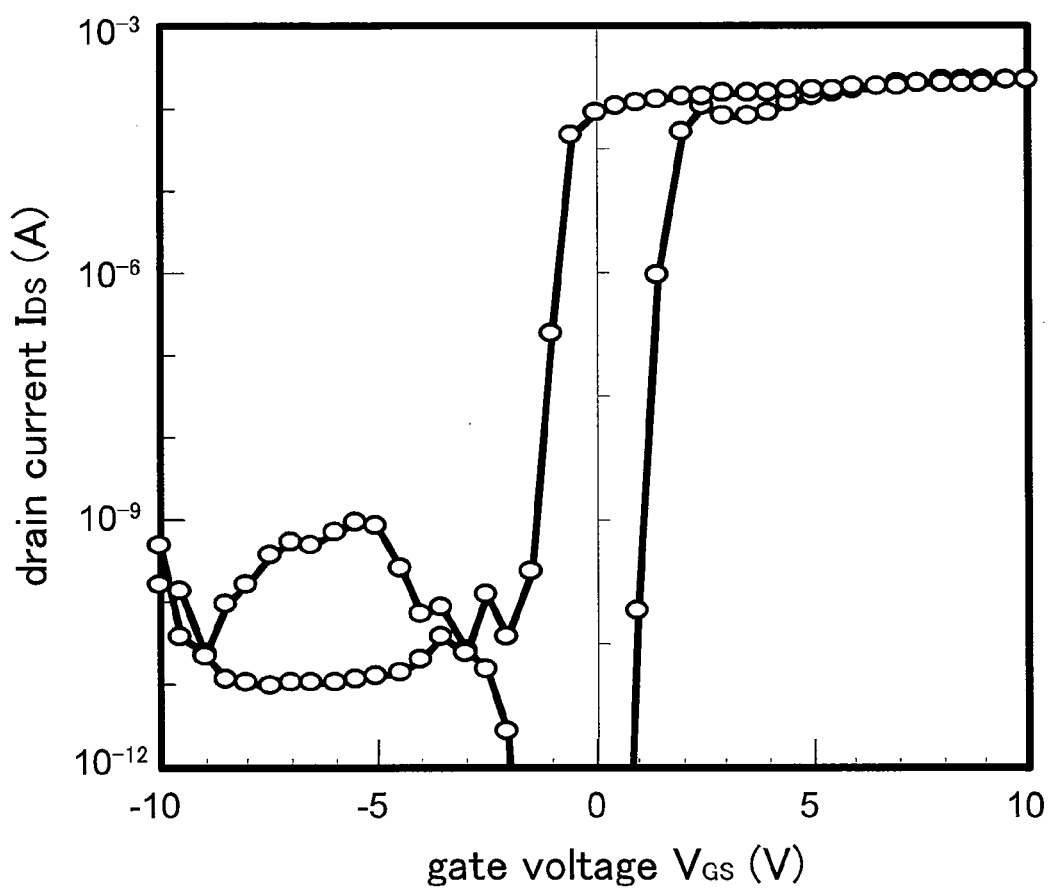
FIG. 3B is a graph showing the sub-threshold characteristic of the MFSFET of the first embodiment.
Figure 4:
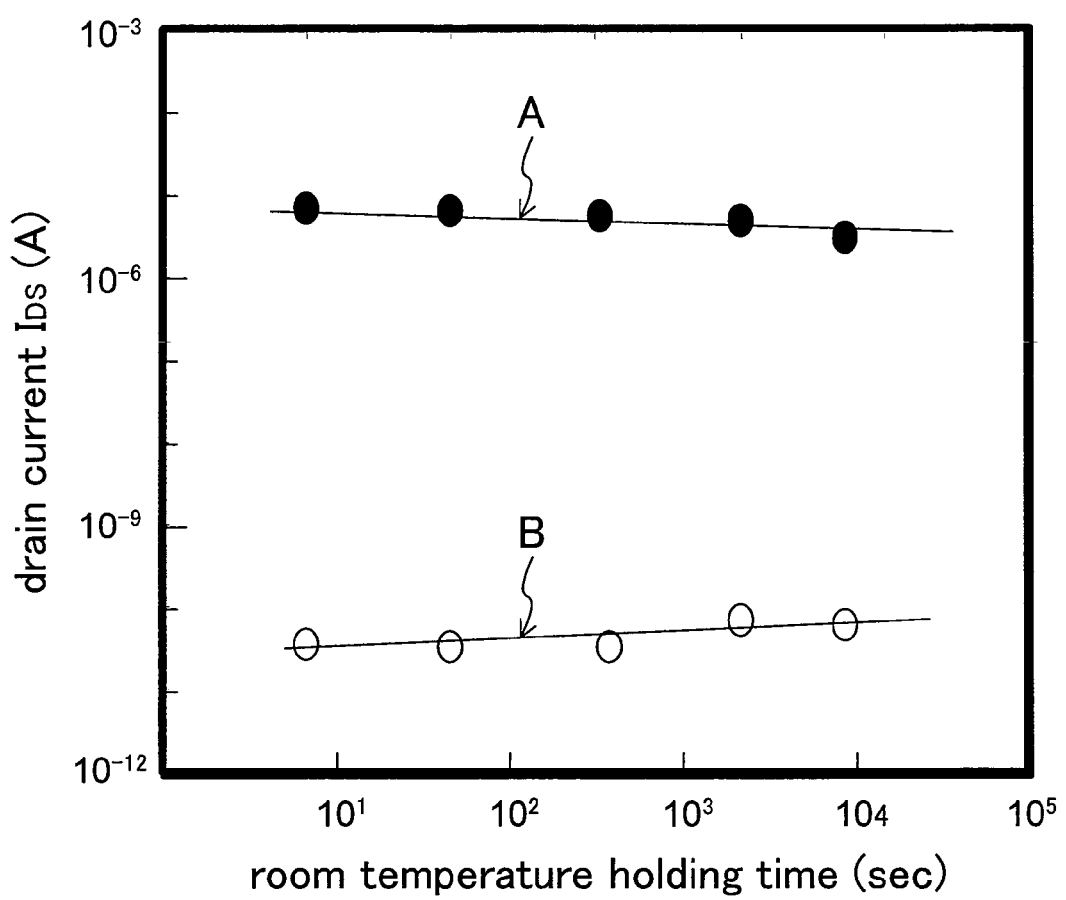
FIG. 4 is a diagram showing a data holding characteristic of the MFSFET of the first embodiment.

FIG. 3B is a graph in which the drain current $I_{DS}$ is plotted when a gate voltage $V_{GS}$ is swept from −10 V to +10 V. Hysteresis is observed in the drain current. When the gate voltage is swept from −10V, the drain current flowing at a gate voltage of 0 V is as low as 1 pA or less. When the gate voltage is swept from 10 V, the drain current at a gate voltage of 0 V is as high as 1 μA or more. This is because the application of a negative voltage causes the depletion of the channel 14 whose resistance in turn becomes high, while the application of a positive voltage causes accumulation of charge in the channel 14 whose resistance in turn becomes low, as described above. In addition, even when the voltage is cut off, the remanent polarization of the PZT film 13 exists, so that the accumulation of charge is maintained. Actually, as shown in FIG. 4, even after the MFSFET 21 is allowed to stand at room temperature for 10$^5$ seconds, the ratio of the drain current $I_{DS}$ in the OFF state (curve B in FIG. 4) and the drain current $I_{DS}$ in the ON state (curve A in FIG. 4) is maintained.

Figure 5:
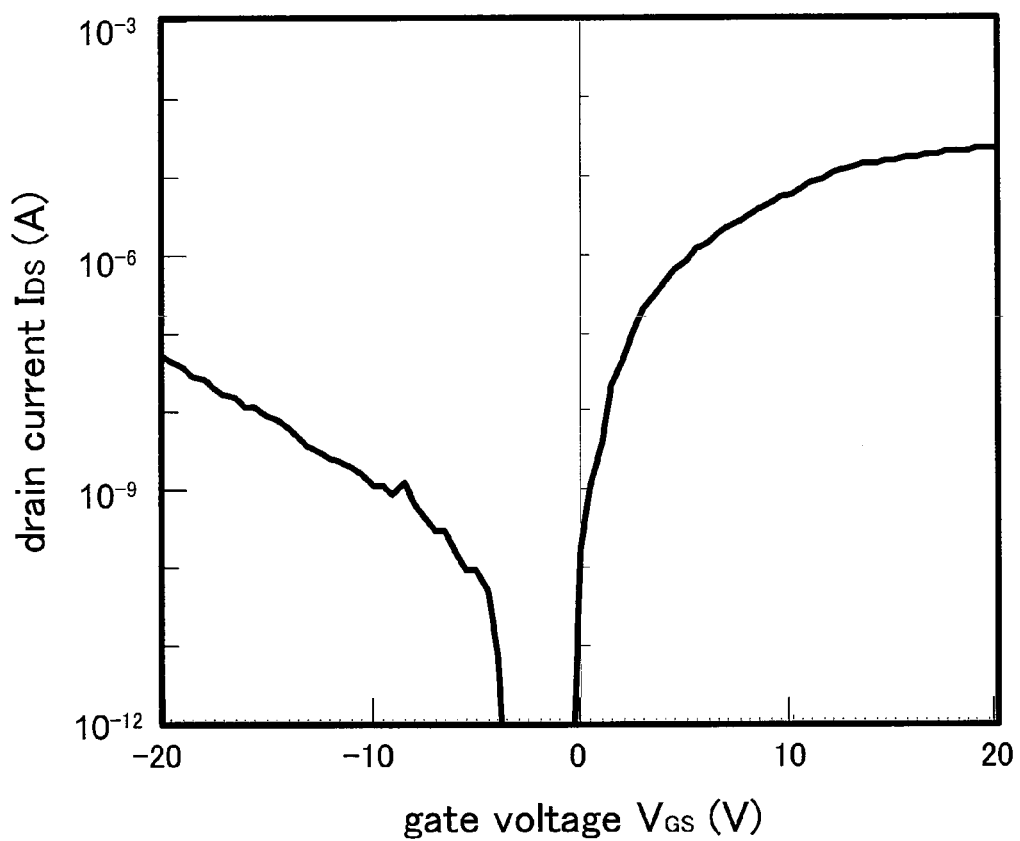
FIG. 5 is a graph showing a sub-threshold characteristic of a MISFET according to the first embodiment.

FIG. 5 shows a result from examination of the sub-threshold characteristics of the MISFETs 22 and 23 used as selection switching elements. Note that a SiN film having a film thickness of 100 nm was used as the paraelectric film 16 (gate insulating film).

Next, referring back to FIG. 2A, an operation of the semiconductor memory device of this embodiment will be described. Note that voltages applied to the electrodes during write and read operations are shown in FIG. 6.

In the non-access state, the first gate electrode 12 and the second gate electrodes 17a and 17b are grounded. By grounding the second gate electrodes 17a and 17b, the two MISFETs 22 and 23 are switched OFF. In this case, even when any voltage is applied to the source and drain electrodes 15a and 15b, write disturbance does not occur in the MFSFET 21.

A data write operation is performed as follows. Initially, while a positive voltage (e.g., 10 V) is applied to the second gate electrodes 17a and 17b to cause the MISFETs 22 and 23 to be in the ON state, a voltage is applied to the source electrode 15a, the drain electrode 15b and the first gate electrode 12, and a voltage is applied between the source electrode 15a and the first gate electrode 12 and between the drain electrode 15b and the first gate electrode 12 so that the polarization of the ferroelectric film 13 is all directed upward. As a result, a reset operation is performed.

Next, while a positive voltage (e.g., 10 V) is applied to the second gate electrodes 17a and 17b to cause the MISFETs 22 and 23 to be in the ON state, a predetermined voltage is applied to the source electrode 15a, the drain electrode 15b and the first gate electrode 12. As a result, a vertical electric field is applied between the channel (semiconductor film) 14 on the first gate insulating film (ferroelectric film) 13, and the first gate electrode 12. For example, when data "1" is written, the source electrode 15a and the drain electrode 15b are grounded, and a positive voltage (e.g., 10 V) is applied to the first gate electrode 12. On the other hand, when data "0" is written, the first gate electrode 12 is grounded, and a positive voltage (e.g., 10 V) is applied to the source electrode 15a and the drain electrode 15b.

A data read operation is performed as follows. While the first gate electrode 12 is grounded and a positive voltage (e.g., 10 V) is applied to the second gate electrodes 17a and 17b to cause the MISFETs 22 and 23 to be in the ON state, a voltage (e.g., 1 V) is applied between the source electrode 15a and the drain electrode 15b to apply a power source voltage to the drain electrode 15f of the load element (MISFET) 24, and then an intermediate potential between the memory cell and the load element (i.e.,g between the electrodes 15b and 15e) is read. Thus, data can be read.

Here, data can be read by the following method. The MFSFET 21 having the drain current characteristics in the ON and OFF states shown in FIG. 4 has a gate length (L) of 1 μm, a gate width (W) of 100 μm, and a read voltage of 0.1 V. Therefore, the MFSFET 21 has a resistance value per unit length (W/L=1) of about 1 MΩ and about 1 TΩ in the ON and OFF states, respectively. The selection transistors 22 and 23 connected to the MFSFET 21 have the sub-threshold characteristic shown in FIG. 5. The MISFETs 22 and 23 each have a gate length (L) of 2 µm, a gate width (W) of 8 µm, and a read voltage of 0.1 V. Therefore, the MISFETs 22 and 23 each have a resistance value per unit length (W/L=1) of about 40 kΩ in the ON state.

In the present invention, since the load element connected to the memory cell includes the MISFET 24 which has the same structure as that of the selection transistor, the resistance value of the load element can vary from about 40 kΩ in the ON state to about 1 TΩ in the OFF state, depending on the magnitude of a voltage applied to the third gate electrode 17c. Therefore, during a read operation, a predetermined voltage is applied to the third gate electrode 17c of the load element to set the resistance value of the load element to be between 1 MΩ and 1 TΩ, and then an intermediate potential between the memory cell and the load element is read, thereby making it possible to determine data.

Here, the resistance value of the load element can be easily set to any value between the OFF resistance value and the ON resistance value of the memory element by, for example, setting the ratio of the gate capacitance value of the MFSFET 21 and the gate capacitance value of the MISFET 24 to a predetermined value.

Also, during a read operation, the voltage applied to the MFSFET 21 is desirably set to a voltage which does not destroy the polarization of the ferroelectric material. In this case, written information is not lost during the read operation. Thus, a non-destructive read operation can be achieved. It is known that the number of times of reversal of the polarization of a ferroelectric material is limited to about $10^{10}$ to $10^{12}$ due to polarization fatigue. Therefore, the number of times of a read operation is limited in conventional capacitor-type ferroelectric material memories, which perform a destructive read operation. In contrast to this, the semiconductor memory device of this embodiment can achieve a non-destructive read operation, so that the read operation can be performed an infinite number of times.

Next, a circuit configuration in which the memory cells 100 of FIG. 1 are arranged in a matrix (array) with rows and columns will be described with reference to FIG. 7. Note that, in FIG. 7, memory cells 100-00, 100-01, 100-10 and 100-11 are arranged in a matrix with two rows and two columns, where two cells are arranged in each row while two cells are arranged in each column.

The first gate electrode of the memory element 21 in each cell is connected to a first word line 30-0 or 30-1. The second gate electrodes of the selection switching elements 22 and 23 in each cell are connected to a second word line 40-0 or 40-1 and a third word line 50-0 or 50-1, respectively. The source electrode 15a in each cell is connected to a source line 70-0 or 70-1. The drain electrode 15b in each cell is connected to a bit line 80-0 or 80-1. An end of each of the bit lines 80-0 and 80-1 is connected to a corresponding load element 24.

It is assumed in this embodiment that memory cells are alternately reversed and arranged in the column direction, so that vertically adjacent memory cells share the drain electrode 15b and the source electrode 15a. As a result, the area of each cell can be reduced.

Next, an operation of reading data written in a memory cell will be described with reference to FIG. 7. It is here assumed that written data is stored as a resistance level, i.e., "0" (high resistance) or "1" (low resistance). During this operation, the source lines 70-0 and 70-1, the first word lines 30-0 and 30-1, and the second word lines 40-1 and 50-1 to which non-selected memory cells are connected, are all grounded. Therefore, the non-selected memory cells are not erroneously read.

Firstly, a positive voltage (e.g., 10 V) is applied to the second word lines 40-0 and 50-0, so that the MISFETs 22 and 23 in the memory cells 100-00 and 100-10 are caused to go to the ON state. Thereafter, a voltage is applied to the gate electrode 17c of the MISFET of the load element 24, so that the load element 24 is caused to have a resistance value which is equal to or lower than the resistance value corresponding to "0" and is equal to or higher than the resistance value corresponding to "1". In this case, if the resistance of the memory cell is higher than that of the load element 24, the intermediate potential between the load element 24 and the memory cell is output as a value close to the power source voltage, and if the resistance of the memory cell is lower than that of the load element 24, the intermediate potential between the load element 24 and the memory cell is output as a value close to the ground voltage. In other words, when a voltage close to the power source voltage is output, the data is determined as "0", and when a value close to the ground voltage is output, the data is determined as "1".

Figure 7:
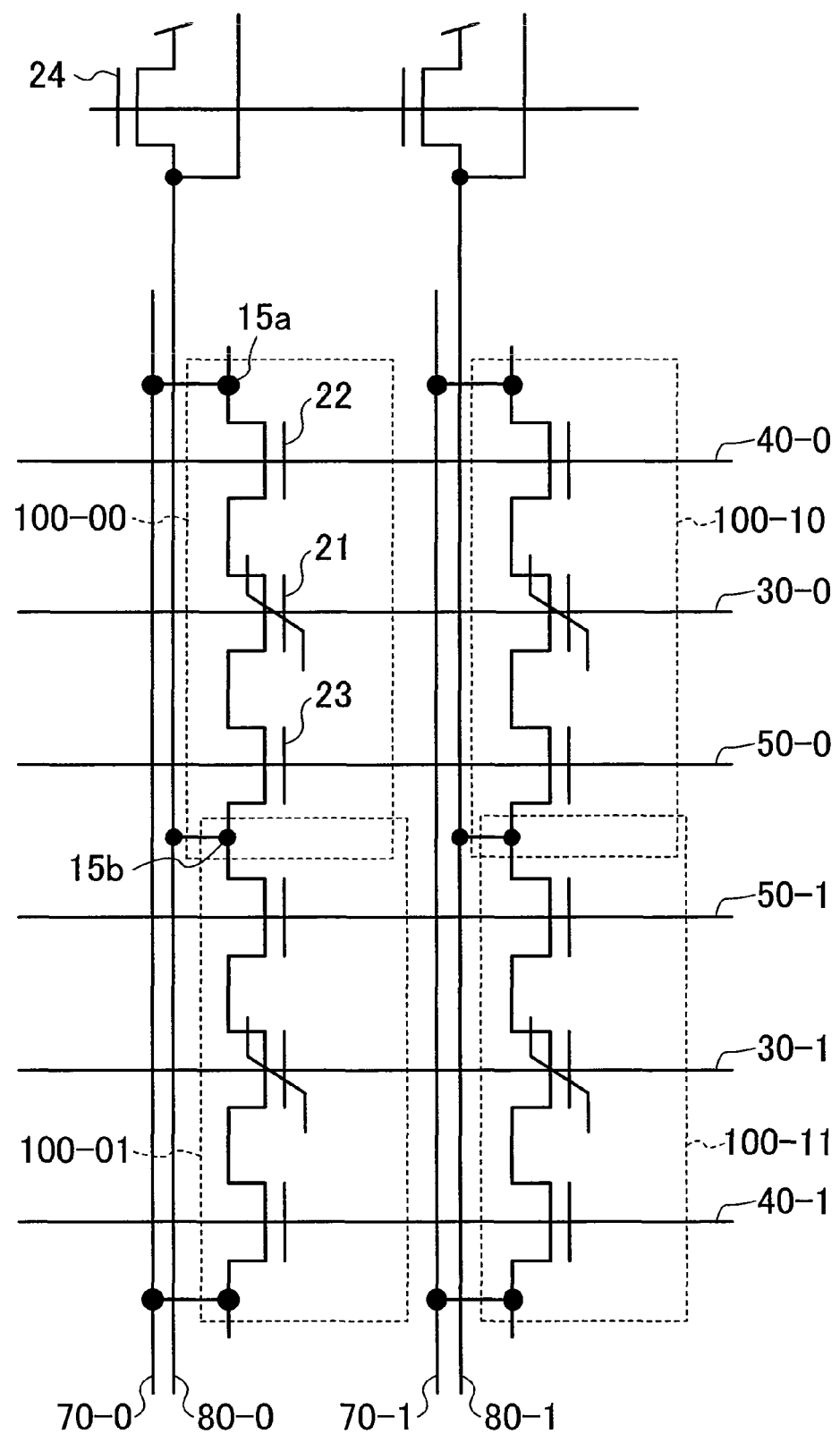
FIG. 7 is a diagram showing a circuit configuration in which memory cells according to the first embodiment are arranged in an array.
Figure 8:
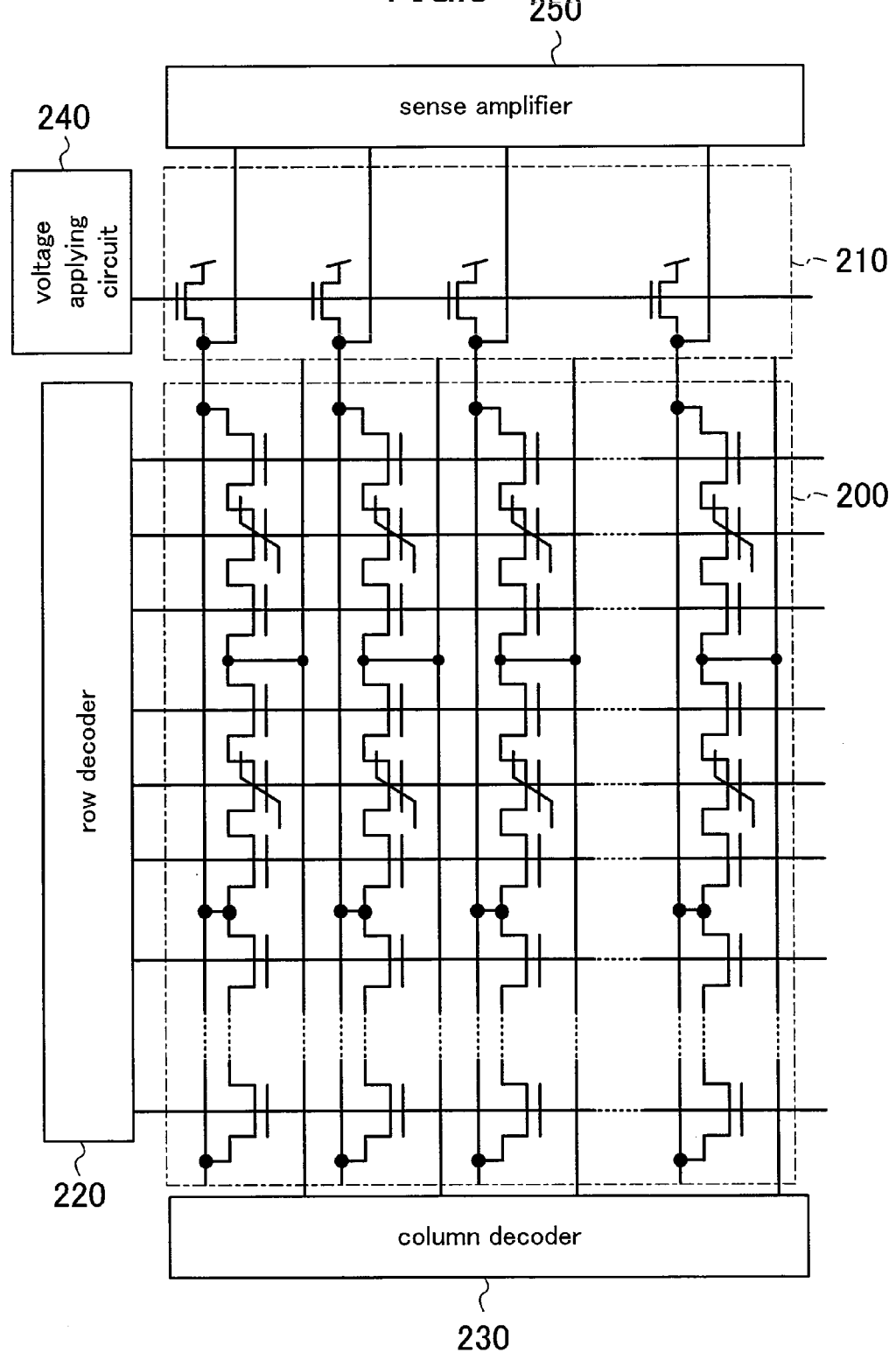
FIG. 8 is a circuit diagram showing a control circuit for controlling an operation of the memory cells arranged in an array according to the first embodiment.

FIG. 8 is a circuit diagram showing a configuration of a control circuit for controlling an operation of the memory cells arranged in an array shown in FIG. 7. An output circuit 210 for outputting data of memory cells arranged in the column direction, a row decoder 220 for controlling a voltage applied to each word line, and a column decoder 230 for controlling a voltage applied to each bit line, are connected to the memory cell array 200. A voltage applying circuit 240 for controlling the resistance of each load element in the output circuit 210 is connected to the output circuit 210. Note that the specific configuration and operation of each control circuit are the same as those employed in a typical semiconductor memory device and will not be described.

Next, a method for producing the semiconductor memory device of this embodiment will be described with reference to FIGS. 9A to 9E. FIGS. 9A to 9E are cross-sectional views showing the method for fabricating the semiconductor memory device of this embodiment.

Figure 9A:
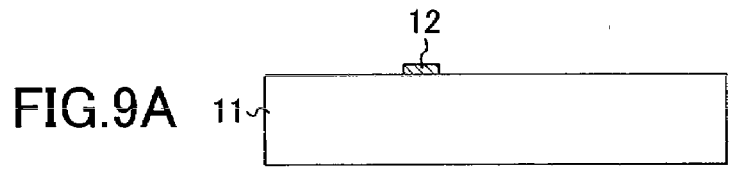
FIGS. 9A to 9E are cross-sectional view showing a method for fabricating the semiconductor memory device of the first embodiment.

Firstly, as shown in FIG. 9A, an SRO film having a thickness of 30 nm is formed on the STO substrate 11 at a substrate temperature of 700° C. by pulsed laser deposition (PLD). A resist is applied on the SRO film, followed by patterning. Thereafter, the SRO film is etched by ion milling. Thus, the first gate electrode 12 is formed.

Figure 9B:
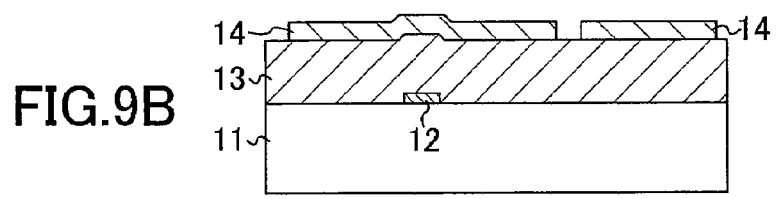

Next, as shown in FIG. 9B, etching damage is recovered by heating in oxygen atmosphere, and thereafter, the PZT film 13 having a thickness of 450 nm is grown on the substrate 11 by PLD, where the substrate temperature is 700° C. In this case, the composition of a sinter used as a target has a molar ratio of Pb:Zr:Ti=1:0.52:0.48. The lattice mismatch between the PZT film 13 having this molar ratio, and the STO substrate 11 and the SRO film 12 is within 3%. The SRO film 12 and the PZT film 13 can be epitaxially grown under the aforementioned growth conditions. A surface of the PZT film 13 grown by this method was observed using an atomic force microscope (AFM). As a result, the means square value of roughness was 3 nm or less, i.e., considerably even.

Next, while the substrate temperature was heated at 400° C. in the same chamber of the PLD apparatus, the ZnO film 14 having a thickness of 30 nm is formed. A resist is applied to the ZnO film 14, followed by patterning. Thereafter, the ZnO film 14 excluding the active region is etched using dilute nitric acid. As a result, the channel 14 is formed.

Figure 9C:
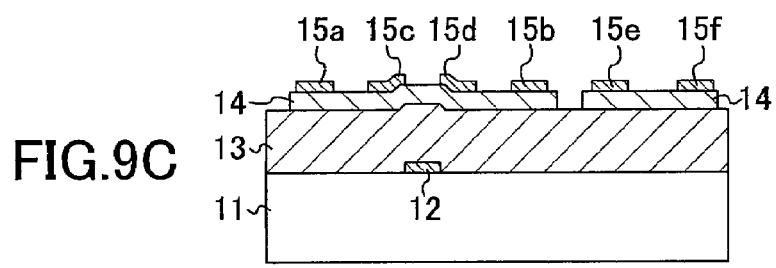

Next, as shown in FIG. 9C, a resist is applied on the ZnO film 14, followed by patterning. Thereafter, a Ti film having a thickness of 20 nm and a Pt film having a thickness of 30 nm are formed using electron beam evaporation, and thereafter, the resist is removed using a solvent. As a result, the source/drain electrodes 15a to 15f are formed at desired positions.

Figure 9D:
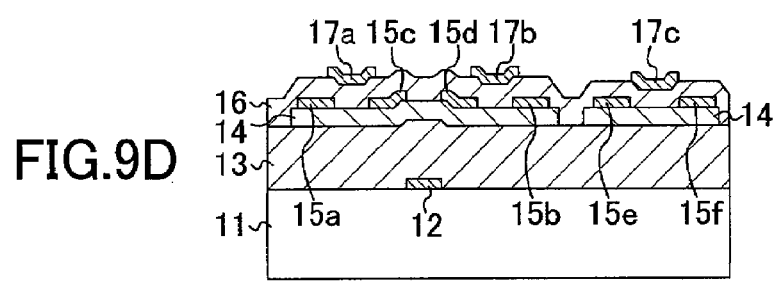

Next, as shown in FIG. 9D, the SiN film 16 having a thickness of 100 nm is formed on the ZnO film 14 by sputtering. A resist is applied on the SiN film 16, followed by patterning. Thereafter, a Ti film having a thickness of 30 nm and a Pt film having a thickness of 170 nm are formed by electron beam evaporation, and thereafter, the resist is removed using a solvent. As a result, the second gate electrodes 17a and 17b and the third gate electrode 17c are formed at desired positions.

Figure 9E:
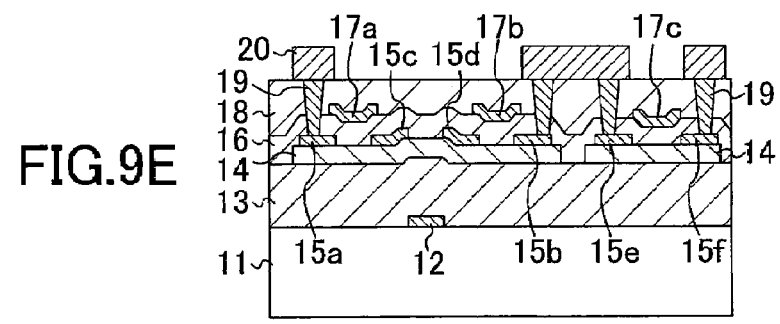

Next, as shown in FIG. 9E, the $SiO_2$ film (interlayer insulating film) 18 is formed on the SiN film 16 by plasma CVD. Thereafter, a resist is applied on the $SiO_2$ film 18, followed by patterning. Thereafter, a contact hole penetrating through the $SiO_2$ film 18 and the SiN film 16 is formed on the source/drain electrodes by dry etching. Thereafter, tungsten is deposited in the open contact hole by blanket CVD. Thereafter, the tungsten is removed from a surface of the $SiO_2$ film 18 by chemical mechanical polishing (CMP). As a result, the plug 19 is formed. Finally, an Al film is formed on the $SiO_2$ film by sputtering, and a resist is applied on the Al film, followed by patterning, whereby a wiring pattern is formed. Thus, the semiconductor memory device of FIG. 2A is completed.

Variation 1 of First Embodiment

Figure 10:
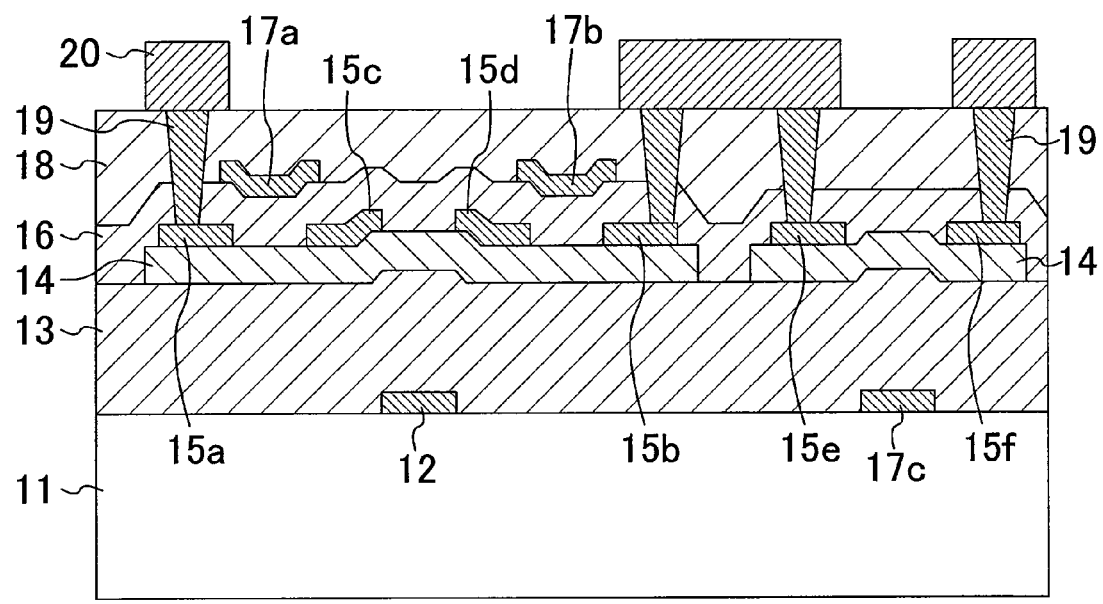
FIG. 10 is a cross-sectional view showing a configuration of a semiconductor memory device according to Variation 1 of the first embodiment.

FIG. 10 is a cross-sectional view showing a configuration of a semiconductor memory device according to Variation 1 of the first embodiment. Although the load element 24 includes a MISFET in the first embodiment, the load element 24 includes the same MFSFET as that of the memory element 21 in Variation 1.

As described above, in the present invention, since the OFF resistance of the memory element 21 is large, if the load element 24 is made of silicon, the element size is considerably large. However, if the load element 24 includes a MISFET sharing the channel (semiconductor film) 14, the load element 24 can have substantially the same element size as that of the memory element 21. Therefore, even if the load element 24 includes the same MFSFET as that of the memory element, the load element 24 can have substantially the same element size as that of the memory element 21.

If the load element 24 includes a MFSFET, a predetermined voltage needs to be applied to the gate electrode 17c of the MFSFET so as to set the load element 24 to have a predetermined resistance value during a read operation. In this case, the polarization state of the ferroelectric film 13 may be changed by a voltage which is applied to the source/drain electrodes 15e and 15f during an operation. As a result, even when a predetermined gate voltage is applied, the resistance of the MFSFET may be changed. Therefore, in order to achieve a stable read operation, it is necessary to prevent the polarization state of the ferroelectric film 13 from being changed by a voltage which is applied to the source/drain electrodes 15e and 15f during the read operation.

Variation 2 of First Embodiment

Figure 11A:
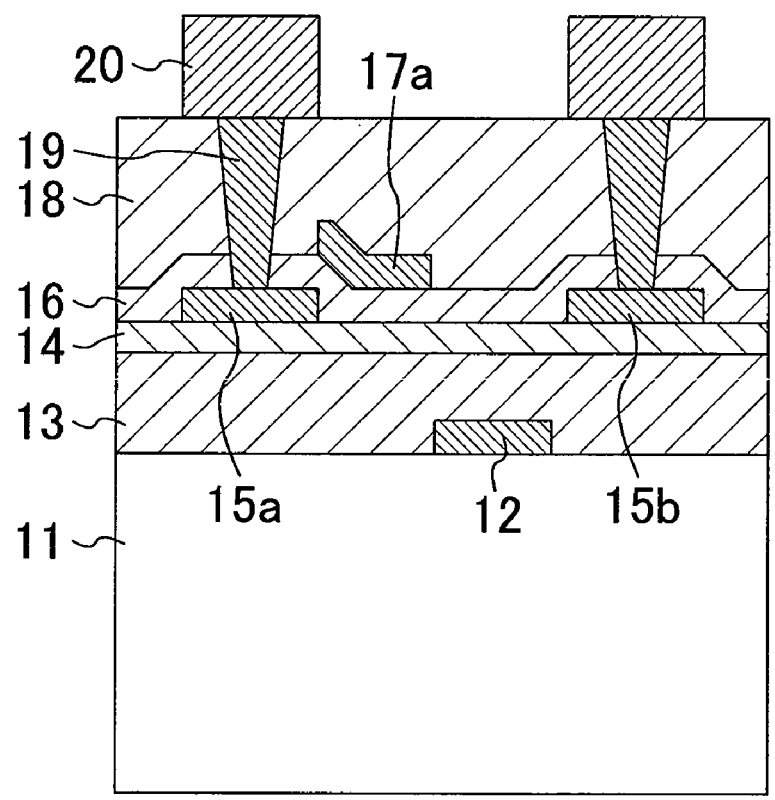
FIG. 11A is a cross-sectional view showing a memory cell according to Variation 2 of the first embodiment.
Figure 11B:
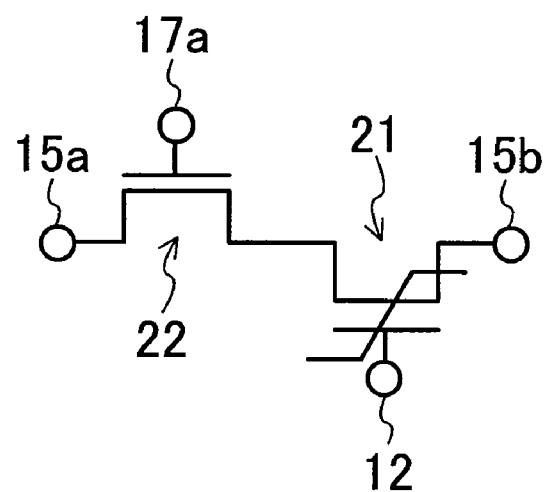
FIG. 11B is an equivalent circuit diagram of the memory cell of Variation 2 of the first embodiment.

FIGS. 11A and 11B are diagrams showing a configuration of a semiconductor memory device according to Variation 2 of the first embodiment. FIG. 11A is a cross-sectional view thereof, and FIG. 11B is an equivalent circuit diagram thereof. Although the selection switching elements 22 and 23 are provided on both sides of the memory element 21 in the memory cell of the first embodiment, a similar operation can be performed even if only a single selection switching element is provided.

Figure 12:
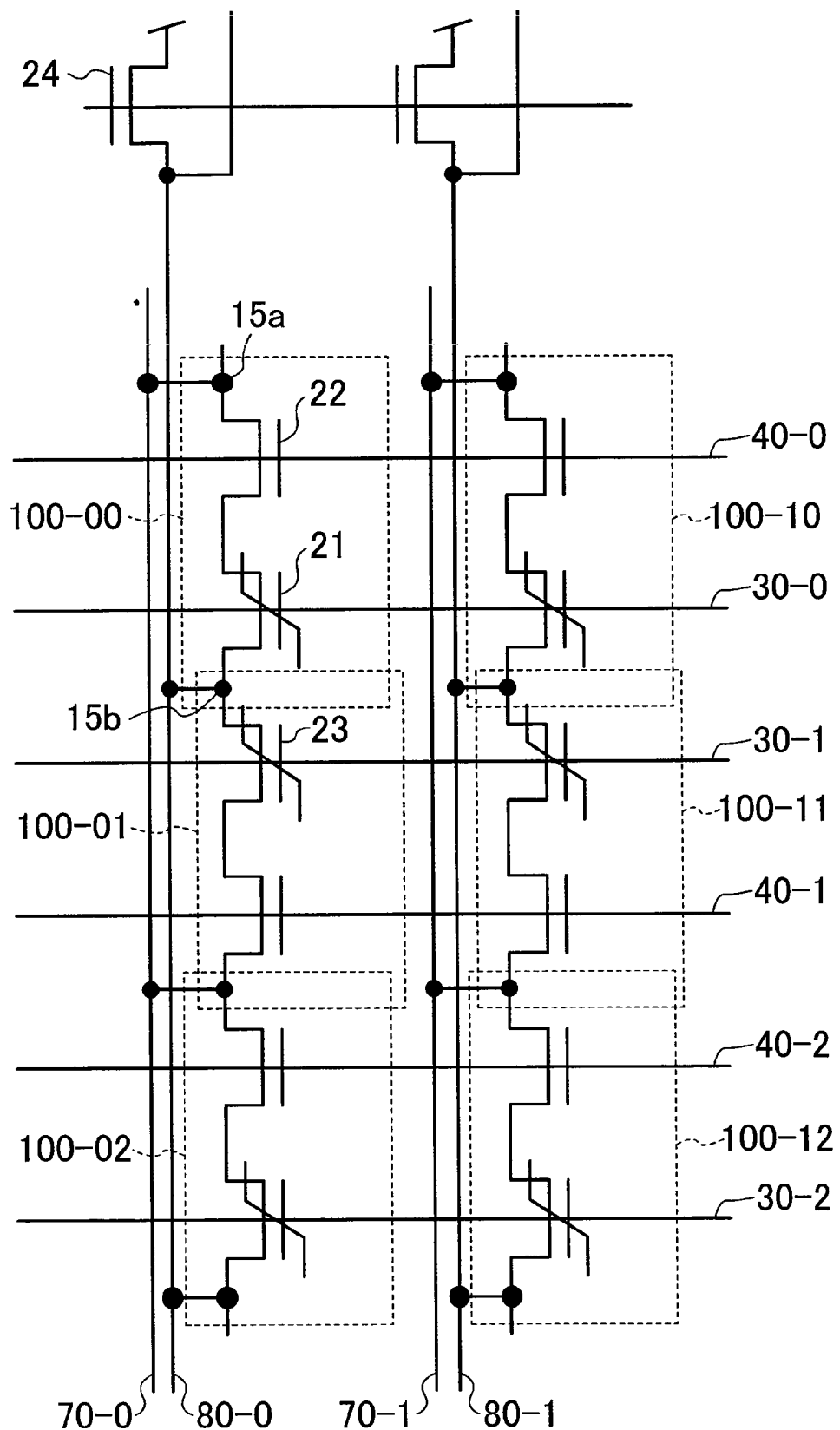
FIG. 12 is a diagram showing a circuit configuration in which the memory cells of Variation 2 of the first embodiment are arranged in an array.

FIG. 12 is a circuit diagram showing a circuit configuration in which the thus-configured memory cells are arranged in a matrix (array) with rows and columns. Note that FIG. 12 shows an example in which the memory cells 100-00, 100-01, 100-02, 100-10, 100-11, and 100-12 are arranged in a matrix with two rows and three columns, where two cells are arranged in each row while three cells are arranged in each column.

Note that the operation of the semiconductor memory device of this variation is the same as that of the first embodiment and will not be described.

Second Embodiment

Figure 13A:
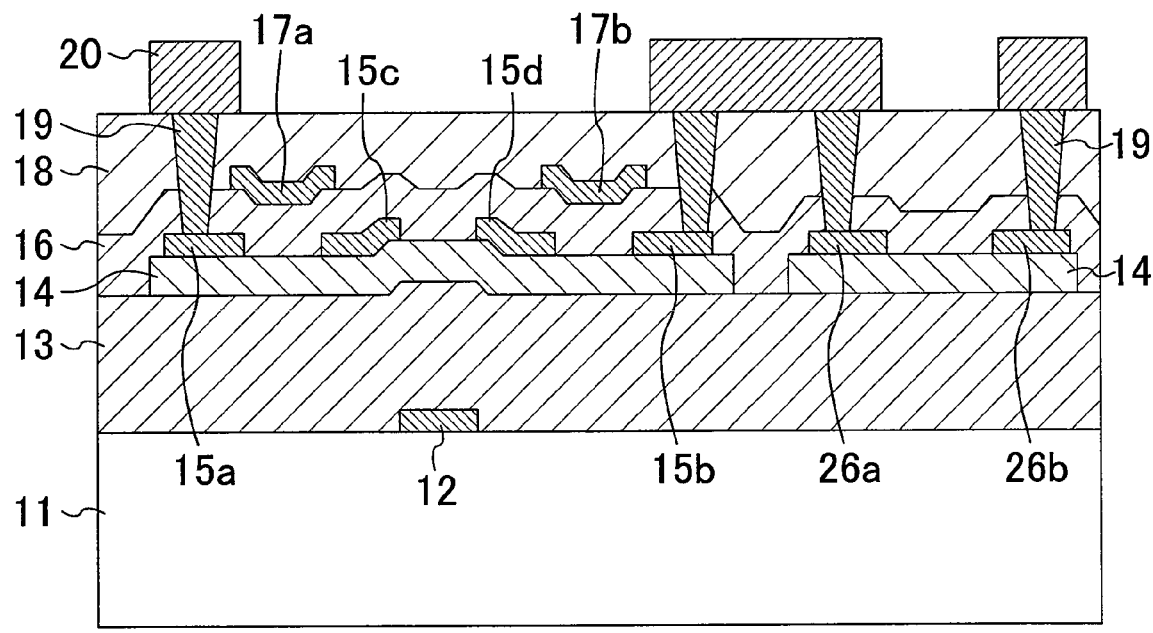
FIG. 13A is a cross-sectional view showing a configuration of a semiconductor memory device according to a second embodiment of the present invention.
Figure 13B:
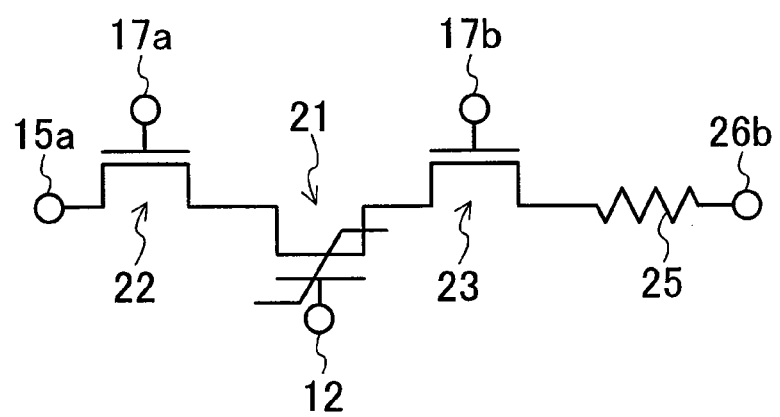
FIG. 13B is an equivalent circuit diagram of the semiconductor memory device according of the second embodiment of the present invention.

FIGS. 13A and 13B are diagrams showing a semiconductor memory device according to a second embodiment of the present invention. FIG. 13A is a cross-sectional view thereof, and FIG. 13B is an equivalent circuit diagram thereof.

Although the load element 24 of the first embodiment includes the same MISFET as those of the selection switching elements 22 and 23 (or the same MFSFET as that of the memory element), a load element 25 of this embodiment includes a resistance element made of a ZnO film (semiconductor film) 14 which serves as a resistor.

The ZnO film 14 of this embodiment has a resistance value per unit length (W/L=1) of about 1 TΩ. Therefore, by setting a width W of the resistance element 25 to be about 10 times larger than a gate width of the MFSFET 21 included in the memory element, the resistance value of the resistance element 25 can be set to be between the OFF resistance value and the ON resistance value of the memory element. Therefore, the resistance element 25 can have an element size similar to that of the MFSFET 21.

Third Embodiment

A large memory capacity can be imparted to the semiconductor memory device of FIG. 1 if multi-level data having at least three or more channel resistance values can be stored according to the polarization states of the ferroelectric film in the memory element 21.

Figure 14:
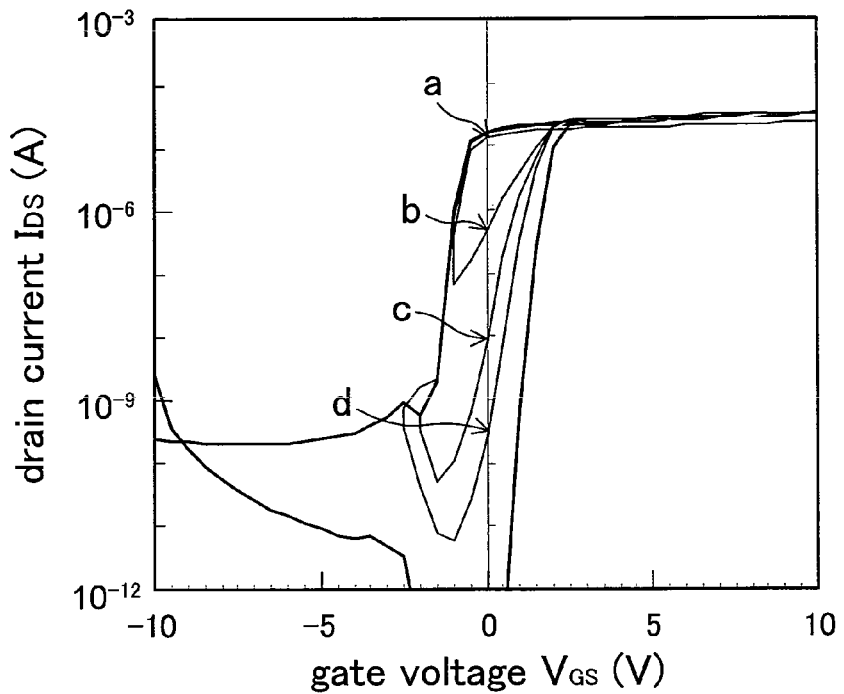
FIG. 14 is a graph showing a sub-threshold characteristic of a MFSFET according to a third embodiment of the present invention.

FIG. 14 is a graph showing a sub-threshold characteristic of a MFSFET 21 according to this embodiment. Note that the drain current $I_{DS}$ was measured by sweeping the voltage of the gate electrode 12 while grounding the source electrode 15c and applying a voltage of 0.1 V to the drain electrode 15d, as shown in FIG. 3A.

As shown in FIG. 14, hysteresis was observed in the drain current $I_{DS}$ when the gate voltage $V_{GS}$ was swept from −10 V to +10 V. When the gate voltage was swept from −10 V, the drain current flowing at a gate voltage of 0 V was as low as 1 pA or less. When the gate voltage was swept from 10 V, the drain current flowing at a gate voltage of 0 V (point a in FIG. 14) was as high as 1 μA or more. This is because the application of a negative voltage causes the depletion of the channel 14 whose resistance in turn becomes high, while the application of a positive voltage causes the accumulation of charges in the channel 14 whose resistance in turn becomes low, as described above.

Moreover, after a voltage of, for example, −1.5 V, −2.0 V or −5.0 V is applied to the gate electrode 12, a drain current flowing at a gate voltage of 0 V takes an intermediate value (points b, c or d in FIG. 14) between the drain current flowing at a gate voltage of 0 V when the gate voltage is swept from −10 V and the drain current flowing at a gate voltage of 0 V when the gate voltage is swept from 10 V. Thus, multi-level data can be stored in a memory cell as one of the magnitudes of the drain currents flowing at a gate voltage of 0 V.

Figure 15:
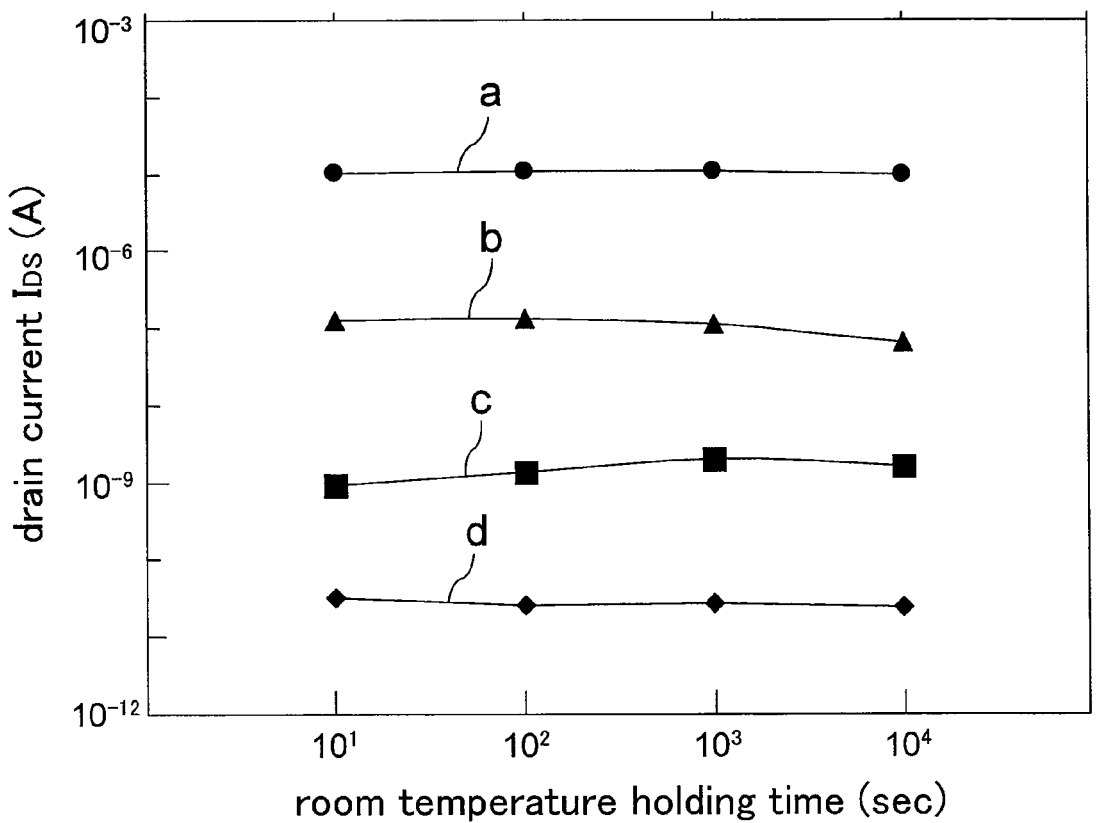
FIG. 15 is a diagram showing a data holding characteristic of the MFSFET of the third embodiment.

In addition, even when the voltage is cut off, the remanent polarization of the PZT film 13 exists, so that the accumulation of charges is maintained. Actually, as shown in FIG. 15, even after the MFSFET 21 which stores multi-level data corresponding to points a to d of FIG. 14 is allowed to stand at room temperature for $10^4$ seconds, the ratio of the drain currents $I_{DS}$ corresponding to points a to d is maintained.

Next, an operation of the semiconductor memory device of this embodiment will be described with reference to FIG. 2A.

In the non-access state, the gate electrode 12 of the MFSFET 21 and the gate electrodes 17a and 17b of the MISFETs 22 and 23 are grounded. By grounding the second gate electrodes 17a and 17b, the two MISFETs 22 and 23 are switched OFF. In this case, even when any voltage is applied to the source and drain electrodes 15a and 15b, write disturbance does not occur in the MFSFET 21.

A data write operation is performed as follows. Initially, while a positive voltage (e.g., 10 V) is applied to the gate electrodes 17a and 17b to cause the MISFETs 22 and 23 to be in the ON state, a voltage is applied to the source electrode 15a, the drain electrode 15b and the gate electrode 12, and a voltage is applied between the source electrode 15a and the gate electrode 12 and between the drain electrode 15b and the gate electrode 12 so that the polarization of the ferroelectric film 13 is all directed upward. As a result, a reset operation is performed.

Next, while a positive voltage (e.g., 10 V) is applied to the gate electrodes 17a and 17b to cause the MISFETs 22 and 23 to be in the ON state, a predetermined voltage is applied to the source electrode 15a, the drain electrode 15b and the first gate electrode 12. As a result, a vertical electric field is applied between the channel (semiconductor film) 14 and the gate electrode 12 on the gate insulating film (ferroelectric film) 13.

For example, four data values "0", "1", "2" and "3" can be written as follows.

When data "0" is written, the gate electrode 12 is grounded, and a positive voltage (e.g., 3.5 V) is applied to the source and drain electrodes 15a and 15b. When data "1" is written, the gate electrode 12 is grounded, and a positive voltage (e.g., 2.5 V) which is smaller than when data "0" is written is applied to the source and drain electrodes 15a and 15b. Similarly, when data "2" is written, the gate electrode 12 is grounded, and a positive voltage (e.g., 1.5 V) which is smaller than when data "1" is written is applied to the source and drain electrodes 15a and 15b. Also, when data "3" is written, the gate electrode 12 is grounded, and a positive voltage (e.g., 0 V) which is smaller than when data "2" is written is applied to the source and drain electrodes 15a and 15b. As a result, different amounts of polarization are accumulated in the gate insulating film (ferroelectric film) 13. Note that the amounts of upward polarizaton in this case are in order of "3">"2">"1">"0".

Next, the four data values "0", "1", "2" and "3" can be read as follows.

The MFSFET 21, which has the drain current characteristic indicated by points a to d of FIG. 14, has a gate length (L) of 1 μm, a gate width (W) of 100 μm, and a read voltage of 0.1 V. Therefore, the MFSFET 21 has a channel resistance value per unit length (W/L=1) of about 1 MΩ (data "3"), about 100 MΩ (data "2"), about 10 GΩ (data "1"), and about 1 TΩ (data "0"). The selection switching elements 22 and 23 connected to the MFSFET 21 have the sub-threshold characteristic of FIG. 5. The MISFET included in each of the selection switching elements 22 and 23 has a gate length (L) of 2 μm, a gate width (W) of 8 μm, and a read voltage of 0.1 V. Therefore, the MISFET has a resistance value per unit length (W/L=1) of about 40 kΩ in the ON state.

Since the load element connected to the memory cell includes the MISFET 24 which has the same structure as that of the selection switching element, the resistance value of the load element can vary from about 40 kΩ in the ON state to about 1 TΩ in the OFF state, depending on the magnitude of a voltage applied to the gate electrode 17c. Therefore, during a read operation, a predetermined voltage is applied to the gate electrode 17c of the load element to set the resistance value of the load element to be between each channel resistance value, and then an intermediate potential between the memory cell and the load element is read, thereby making it possible to determine the four data values.

However, if data having a small channel resistance value is stored, then when the resistance value of the load element is set to be small, a large voltage is likely to be applied to a memory element during a read operation, so that the data is likely to be disturbed. Therefore, it is desirable that data determination be performed in order of channel resistance value, highest first, during a read operation.

Figure 16:
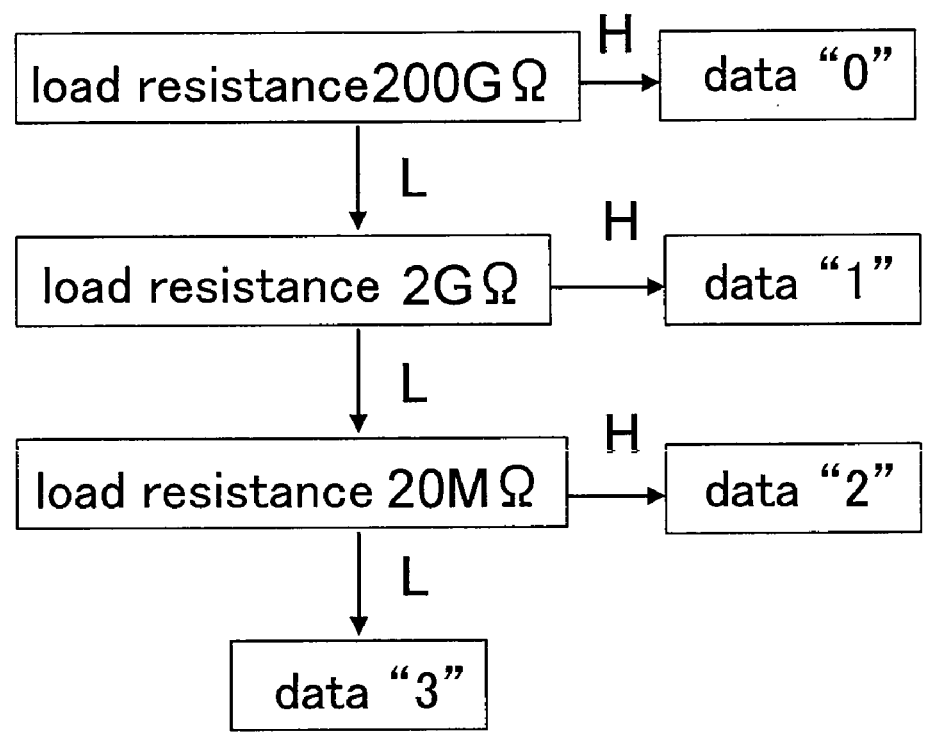
FIG. 16 is a step diagram showing a read operation of the semiconductor memory device of the third embodiment.

Specifically, as shown in FIG. 16, it is firstly determined whether or not data is "0". In this case, when the data is determined to be other than "0", control proceeds to the next step, in which it is determined whether or not the data is "1". In this case, when the data is determined to be other than "1", control proceeds to the next step, in which it is determined whether or not the data is "2". In this case, when the data is determined to be other than "2", the data is determined to be "3". Here, the resistance value of the load element is also decreased step by step.

Figures 17A, 17B:
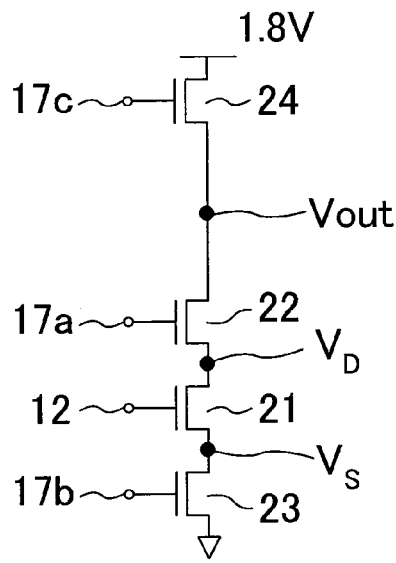
FIG. 17A is a circuit diagram for describing a read operation of the semiconductor memory device of the third embodiment.
FIG. 17B is a table showing values of output voltages, and values applied to a memory element, when a read operation is performed while a resistance value of a load element is varied.

A specific step will be described with reference to FIGS. 17A and 17B, where the power source voltage is 1.8 V. Data written in the memory element 21 is read as follows. As shown in FIG. 17A, while a voltage is applied to the gate electrodes 17a and 17b to cause the MISFETs 22 and 23 to be in the ON state, a voltage is applied to the source and drain electrodes, and a change in channel conductivity depending on the polarization state of the ferroelectric film 13 is detected by detecting an intermediate potential (output voltage) Vout between the memory element 21 and the load element 24. FIG. 17B shows a table indicating intermediate potentials Vout which are used to read data stored in the memory element 21 by changing the resistance value of the load element 24, and voltages Vs and Vd which are applied to the source and drain of the memory element 21.

Initially, in order to read data "0" corresponding to a high channel resistance value, the resistance value of the load element 24 is set to 200 G ($2 \times 10^{11}$) Ω. This value is ⅕ of the channel resistance value ($1 \times 10^{12}$) Ω of data "0". In this case, as shown in the table of FIG. 17B, when data is "0", the output voltage Vout is 1.50 V, and when data is the other values "1", "2" and "3", the output voltage Vout is 0.09 V or less. In other words, when the output voltage Vout is 1.50 V, data stored in the memory element 21 is determined to be "0".

Next, when the output voltage Vout is 0.09 V or less, i.e., the stored data is determined not to be "0", the resistance value of the load element 24 is decreased to 2 G ($2 \times 10^9$) Ω. Note that this value is ⅕ of the channel resistance value ($1 \times 10^{10}$) Ω of data "1". In this case, when data is "1", the output voltage Vout is 1.50 V, and when data is the other values "2" and "3", the output voltage Vout is 0.09 V or less. In other words, when the output voltage Vout is 1.50 V, data stored in the memory element 21 is determined to be "1".

Next, when the output voltage Vout is 0.09 V or less, i.e., the stored data is determined not to be "1", the resistance value of the load element 24 is reduced to 20 M ($2 \times 10^7$) Ω. Note that this value is ⅕ of the channel resistance value ($1 \times 10^8$) Ω of data "2". In this case, when the data is "2", the output voltage Vout is 1.80 V, and when the data is "3", the output voltage Vout is 0.1 V. In other words, when the output voltage Vout is 1.50 V, the data stored in the memory element 21 is determined to be "2", and when the output voltage Vout is 0.1 V, the data stored in the memory element 21 is determined to be "3".

As described above, all the four data values stored in the memory element 21 can be read, without data disturbance, by determining in order of channel resistance value, highest first.

For example, if the load resistance is initially set to 2 G ($2\times10^9$) Ω, then when data "0" is stored in the memory element 21, a voltage of 1.8 V is applied to the memory element 21, so that data stored in the memory element 21 is likely to be disturbed.

Also, for a similar reason, once data determination has been performed with respect to a memory element, it is desirable to prevent a voltage from being applied to the memory element during the subsequent determination.

Also, during a read operation, the voltage applied to the MFSFET 21 is smaller than a write voltage, so that written data is not lost. Thus, a non-destructive read operation can be achieved. It is known that the number of times of reversal of the polarization of a ferroelectric material is limited to about $10^{10}$ to $10^{12}$ due to polarization fatigue. Therefore, the number of times of a read operation is limited in conventional capacitor-type ferroelectric material memories, which perform a destructive read operation. This embodiment can achieve a non-destructive read operation, so that the read operation can be performed an infinite number of times.

Also, the resistance value of each of the selection switching elements 22 and 23 provided on both sides of the memory element 21 is desirably ⅒ or less of the lowest resistance value of multi-level data stored in the memory element 21. If the resistance values of the selection switching elements 22 and 23 are high, a voltage applied to the source terminal of the memory element 21 may be increased during a read operation, so that stored data may be disturbed.

Note that an electron conduction type ferroelectric material transistor has been described as an example in this embodiment above. Alternatively, a hole conduction type ferroelectric material transistor may be employed. In this case, data is desirably determined in order of channel resistance value, lowest first.

Next, an operation of reading four written data values will be described with reference to FIG. 7. It is here assumed that the four data values are "0", "1", "2" and "3" in order of resistance value, highest first. During this operation, the source lines 70-0 and 70-1, the first word lines 30-0 and 30-1, and the second word lines 40-1 and 50-1 to which non-selected memory elements are connected, are all grounded. As a result, the non-selected memory elements are not erroneously read.

Initially, a positive voltage (e.g., 10 V) is applied to the second word lines 40-0 and 50-0, so that the MISFETs 22 and 23 in the memory cells 100-00 and 100-10 are caused to be the ON state. Thereafter, a voltage is applied to the gate electrode 17c of the MISFET of the load element 24, so that the resistance value of the load element 24 is set to a resistance value which is equal to or lower than the resistance value corresponding to "0" and is equal to or higher than the resistance value corresponding to "1", of the four values. In this case, if the resistance value of the memory element is higher than that of the load element 24, an intermediate potential between the load element 24 and the memory cell is output as a value close to the power source voltage. If the resistance value of the memory element is lower than that of the load element 24, the intermediate potential is output as a value close to the ground voltage. In other words, when a voltage close to the power source voltage is output, the data is determined to be "0", and when a voltage close to the ground voltage is output, the data is determined to be other than "0".

Next, the resistance value of the load element 24 is decreased to a resistance value which is equal to or lower than the resistance value corresponding to "1" and is equal to or higher than the resistance value corresponding to "2", and the data is determined in a manner similar to that described above. By repeatedly performing this process, all multi-level states are determined.

Figure 18:
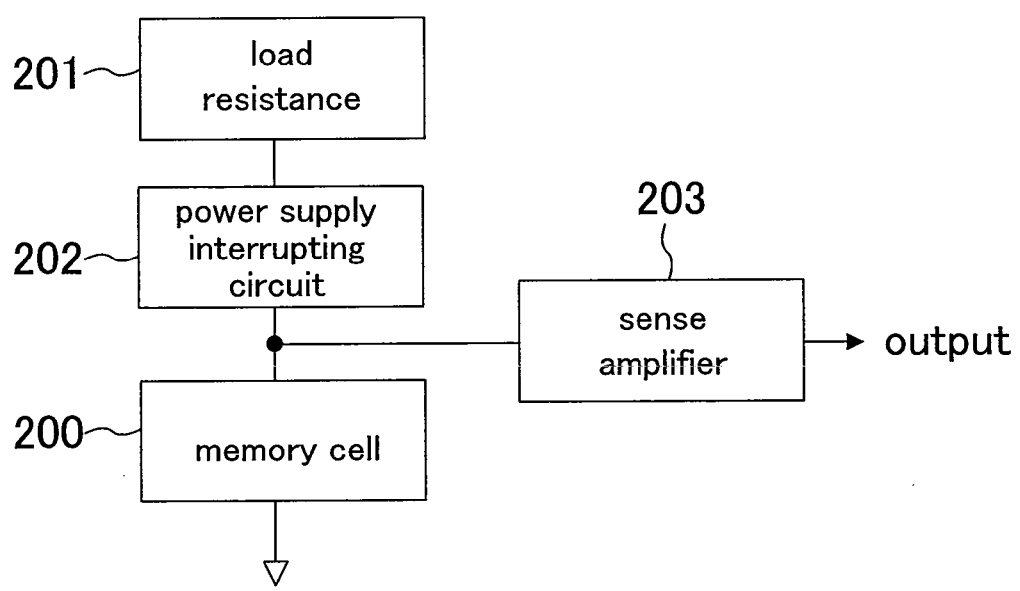
FIG. 18 is a circuit block diagram showing a power source interrupting mechanism according to the third embodiment.

Here, it is desirable to provide a circuit which prevents a voltage from being applied to a memory cell for which data determination has been ended, during the subsequent determination. For example, as shown in FIG. 18, a power source interrupting circuit 202 is provided between the memory cell 200 and the load resistance 201. After data is read from the memory cell 200 and is output by a sense amplifier 203, the power source interrupting circuit 202 is activated so that the power source voltage is prevented from being applied to the memory cell 200.

While the present invention has been described in terms of several embodiments, the present invention is not limited to the embodiments described, but can be practiced with modification and alteration within the spirit and scope of the appended claims. For example, although the substrate 11 is an STO substrate in the aforementioned embodiments, a silicon substrate on which an insulating film is formed, a substrate made of sapphire or lanthanum aluminum oxide ($LaAlO_3$), or the like may be employed. Also, although the ferroelectric film 13 is a PZT film in the aforementioned embodiments, the ferroelectric film 13 may be made of $SrBi_2Ta_2O_9$, $Bi_{4-x}La_xTi_3O_{12}$ or the like. Also, although the semiconductor film (channel) 14 is a ZnO film in the aforementioned embodiments, the semiconductor film (channel) 14 may be made of an oxide semiconductor including a transparent oxide semiconductor, a superconducting oxide semiconductor, an oxide semiconductor undergoing a Mott transition and the like (e.g., $WO_3$, ITO (InO—SnO), IGZO ($InGaO_3(ZnO)_5$), STO, LSCO ($La_{2-x}Sr_xCuO_4$), LCMO ($La_{1-x}Ca_xMnO_3$), PCMO ($Pr_{1-x}Ca_xMnO_3$), etc.), a nitride semiconductor (e.g., indium nitride (InN), gallium nitride (GaN), etc.), a group-IV semiconductor (e.g., polycrystal silicon, amorphous silicon, etc.), or the like. Also, although the paraelectric film 16 is a SiN film in the aforementioned embodiments, the paraelectric film 16 may be made of a ZnO film ($Mg_xZn_{1-x}O$) to which magnesium is added, an aluminum nitride (AlN) film, an aluminum oxide ($Al_2O_3$) film or the like. Also, each electrode may be made of ITO, ZITO (Zn—In—Sn—O) or the like.

Also, a memory cell includes a selection switching element in the aforementioned embodiments. However, if a memory element includes a MFSFET, a similar effect can be obtained even when a memory cell does not include a selection switching element.

Moreover, although the MFSFET has a metal-ferroelectric-semiconductor structure (multilayer structure) in the aforementioned embodiments, the MFSFET may have a metal-ferroelectric-paraelectric-semiconductor structure (multilayer structure), or a structure in which a ferroelectric material is provided between a metal and a semiconductor (e.g., a metal-ferroelectric-metal-paraelectric-semiconductor structure (multilayer structure), etc.). In this case, a similar effect can be obtained.

What is claimed is:
1. A semiconductor memory device comprising:
a memory cell including a memory element including a first field effect transistor having a gate insulating film made of a ferroelectric film, and a selection switching element including a second field effect transistor having a gate insulating film made of a paraelectric film;
a load element for a read operation connected in series to the memory cell; and
a first gate electrode of the first field effect transistor is provided on the ferroelectric film, a second gate electrode of the second field effect transistor is provided on the paraelectric film, and a source electrode and a drain electrode are provided on a major surface of the semiconductor film,
wherein the ferroelectric film and the paraelectric film are stacked with a semiconductor film being interposed therebetween,
the semiconductor film forms a common channel shared by the first field effect transistor and the second field effect transistor,
the load element includes a third field effect transistor having a channel made of the semiconductor film or a resistance element having a resistor made of the semiconductor film, and
data is written into the memory element by applying a predetermined voltage to the second gate electrode to cause the selection switching element to go to an ON state, and applying a predetermined voltage between the first gate electrode and the drain electrode, to change a polarization state of the ferroelectric film.

2. The semiconductor memory device of claim 1, wherein data is read from the memory element by applying a predetermined voltage to the second gate electrode to cause the selection switching element to go to the ON state, and applying a predetermined voltage between the source electrode and the drain electrode, to detect a change in channel conductivity depending on the polarization state of the ferroelectric film, by detecting an intermediate potential between the memory element and the load element.

3. A semiconductor memory device comprising:
a memory cell including a memory element including a first field effect transistor having a gate insulating film made of a ferroelectric film, and a selection switching element including a second field effect transistor having a gate insulating film made of a paraelectric film; and
a load element for a read operation connected in series to the memory cell,
wherein the ferroelectric film and the paraelectric film are stacked with a semiconductor film being interposed therebetween,
the semiconductor film forms a common channel shared by the first field effect transistor and the second field effect transistor,
the load element includes a third field effect transistor having a channel made of the semiconductor film or a resistance element having a resistor made of the semiconductor film,
the memory element has an OFF resistance value providing a low channel conductivity corresponding to a first polarization state of the ferroelectric film, and an ON resistance value providing a high channel conductivity corresponding to a second polarization state of the ferroelectric film, and
a resistance value of the load element is set to any value between the OFF resistance value and the ON resistance value of the memory element.

4. The semiconductor memory device of claim 3, wherein the load element includes the third field effect transistor, and
the resistance value of the load element is set to any value between the OFF resistance value and the ON resistance value of the memory element, by applying a predetermined voltage to a third gate electrode of the third field effect transistor.

5. The semiconductor memory device of claim 3, wherein the load element includes the third field effect transistor, and
the resistance value of the load element is set to any value between the OFF resistance value and the ON resistance value of the memory element, by setting a ratio of a gate capacitance value of the first field effect transistor and a gate capacitance value of the third field effect transistor to a predetermined value.

6. The semiconductor memory device of claim 1, wherein the semiconductor film is made of an oxide semiconductor.

7. The semiconductor memory device of claim 1, wherein the memory cells are arranged in a matrix,
first gate electrodes of the first field effect transistors on each row are connected to a first word line;
second gate electrodes of the second field effect transistors on each row are connected to a second word line,
the source electrodes are connected to a source line,
the drain electrodes on each column are connected to a bit line, and
data is written into each memory element on a selected row by applying a write pulse and a predetermined voltage to the first word line and the second word line on the selected row, and applying a predetermined voltage corresponding to write data to each bit line.

8. The semiconductor memory device of claim 7, wherein the load element is connected to a bit line provided for each column, and
data is read from each a memory element on a selected row by applying a predetermined voltage to the second word line on the selected row, and applying a read pulse to each bit line, to detect an intermediate potential between each load element connected to the each bit line and the memory element.

9. A semiconductor memory device comprising:
a memory element including a first field effect transistor having a gate insulating film made of a ferroelectric film; and
a load element for a read operation including a second field effect transistor having a gate insulating film made of a paraelectric film, and connected in series to the memory element,
wherein the ferroelectric film and the paraelectric film are stacked with a semiconductor film being interposed therebetween, and
the semiconductor film forms a common channel shared by the first field effect transistor and the second field effect transistor.

* * * * *